(12) United States Patent
Yan et al.

(10) Patent No.: US 9,373,629 B1
(45) Date of Patent: Jun. 21, 2016

(54) MEMORY DEVICE AND METHOD FOR FABRICATING THE SAME

(71) Applicant: MACRONIX International Co., Ltd., Hsinchu (TW)

(72) Inventors: Shih-Guei Yan, Hsinchu (TW); Chih-Chieh Cheng, Hsinchu (TW); Wen-Jer Tsai, Hsinchu (TW)

(73) Assignee: MACRONIX International Co., Ltd., Hsinchu (JP)

( * ) Notice: Subject to any disclaimer, the term of this patent is extended or adjusted under 35 U.S.C. 154(b) by 0 days.

(21) Appl. No.: 14/604,116

(22) Filed: Jan. 23, 2015

(51) Int. Cl.
| | |
|---|---|
| H01L 27/108 | (2006.01) |
| H01L 29/76 | (2006.01) |
| H01L 29/94 | (2006.01) |
| H01L 31/113 | (2006.01) |
| H01L 27/115 | (2006.01) |
| H01L 23/535 | (2006.01) |
| H01L 21/768 | (2006.01) |

(52) U.S. Cl.
CPC .... *H01L 27/11568* (2013.01); *H01L 21/76895* (2013.01); *H01L 23/535* (2013.01)

(58) Field of Classification Search
CPC . H01L 21/8229; H01L 21/762; H01L 21/041; H01L 21/2807; H01L 21/0245; H01L 21/3141; H01L 21/242; H01L 21/02241; H01L 21/11568; H01L 27/11507; H01L 29/8615; H01L 29/24

USPC .......... 438/197, 381, 238, 700, 954; 257/288, 257/296, 396, E21.006, E21.126, E21.127, 257/E21.267, E21.32, E21.545, E21.547, 257/E21.645

See application file for complete search history.

(56) References Cited

U.S. PATENT DOCUMENTS

| | | | | |
|---|---|---|---|---|
| 8,553,445 B2* | 10/2013 | Baek | ...................... | G11C 5/025 365/148 |
| 8,730,710 B2* | 5/2014 | Baek | ...................... | G11C 5/025 365/148 |
| 8,786,007 B2* | 7/2014 | Chae | ................ | H01L 27/11551 257/326 |
| 9,171,860 B2* | 10/2015 | Chae | ................ | H01L 27/11551 |
| 9,196,525 B2* | 11/2015 | Shim | ................ | H01L 21/76816 |

* cited by examiner

*Primary Examiner* — David Nhu
(74) *Attorney, Agent, or Firm* — J.C. Patents

(57) ABSTRACT

A memory device is provided. The memory device includes a plurality of stack structures, a plurality of first stepped contacts, and a plurality of second stepped contacts. Each of the stack structures extends in a first direction, and includes a first semiconductor layer and a second semiconductor layer. The second semiconductor layer is disposed above the first semiconductor layer. Each of the first stepped contacts extends in a second direction, and a bottom surface thereof is electrically connected to the first semiconductor layers of an $i+1^{th}$ stack structure and an $i+2^{th}$ stack structure, wherein i is an odd number. Each of the second stepped contacts extends in the second direction, and a bottom surface thereof is electrically connected to the second semiconductor layers of an $n^{th}$ stack structure and the $i+1^{th}$ stack structure. The first direction is different from the second direction.

17 Claims, 21 Drawing Sheets

MEMORY DEVICE AND METHOD FOR FABRICATING THE SAME

BACKGROUND OF THE INVENTION

1. Field of the Invention

The invention relates to a semiconductor device and a method of fabricating the same, and more particularly, the invention relates to a memory device and a method for fabricating the same.

2. Description of Related Art

Memories can be classified into a volatile memory and a non-volatile memory. Data stored in the volatile memory disappears right after power supply is shut down; whereas data stored in the non-volatile memory does not disappear even if power supply is shut down, and the data in the non-volatile memory may be read again right after power supply is restored. Accordingly, the non-volatile memory can be widely applied in electronic products, especially portable products.

With increases in integration and reduction in size for a memory device, short channel effect of horizontal memory devices becomes more severe thereby causing problems such as 2nd bit effect and program disturbance between neighboring memory cells to get worse. Thus, vertical memory devices are developed and introduced, yet interconnection problem of the vertical memory devices is another problem to be solved.

In case a layout of an interconnection of the vertical memory device is to directly connect to a source or a drain of the memory device, interconnections of the source and the drain may be electrically connected to each other to cause failure in operating the memory device. On the other hand, if the interconnection layout of the vertical memory device is routed to a periphery region to connect the source and the drain of the memory device, another problem in which a resistance of a bit line rises may occur. Therefore, it will become an important topic to be discussed in the future as how to solve the interconnection problem of the vertical memory device without sacrificing the resistance of the bit line and a chip area.

SUMMARY OF THE INVENTION

The invention is directed to a memory device and a method for fabricating the same, and capable of solving the problem of the layout of the interconnection of the vertical memory device without sacrificing the resistance of the bit line and the chip area.

The invention provides a method for fabricating a memory device, which includes the following steps. A substrate is provided. The substrate includes a plurality of first blocks and a plurality of second blocks. The first blocks and the second blocks are alternated to each other. Each of the first blocks includes two first regions and a second region, and the second region is disposed between the two first regions. A plurality of stack structures is formed on the substrate in the first blocks and the second blocks. Each of the stack structures extends in a first direction and includes a first semiconductor layer disposed on a part of the substrate; and a second semiconductor layer disposed above the first semiconductor layer. A plurality of word lines are formed on the substrate in each of the first regions. Each of the word lines extends in a second direction and covers a part of a lateral surface and a part of a top surface of each of the stack structures. The first direction is different from the second direction. A charge storage layer is formed between the stack structures and the word lines. A part of the stack structures in the second blocks is removed to expose the first semiconductor layers. A plurality of first stepped contacts are formed in the second blocks. A bottom surface of each of the first stepped contacts is electrically connected to the first semiconductor layers of an $i+1^{th}$ stack structure and an $i+2^{th}$ stack structure. An area of a top surface of each of the first stepped contacts is less than an area of the bottom surface thereof. $i$ is an odd number. A plurality of second stepped contacts are formed in the second regions. A bottom surface of each of the second stepped contacts is electrically connected to the second semiconductor layers of an $i^{th}$ stack structure and the $i+1^{th}$ stack structure. An area of a top surface of each of the second stepped contacts is less than an area of the bottom surface thereof. A plurality of first conductive lines and a plurality of second conductive lines alternated to each other are formed on the substrate. Each of the first conductive lines extends in the first direction and is electrically connected to the top surfaces of the first stepped contacts, which is electrically connected to the first semiconductor layers of the $i+1^{th}$ stack structure and the $i+2^{th}$ stack structure. Each of the second conductive lines extends in the first direction and is electrically connected to the top surfaces of the second stepped contacts, which is electrically connected to the second semiconductor layers of the $i^{th}$ stack structure and the $i+1^{th}$ stack structure.

In an embodiment of the invention, the steps of forming the first stepped contacts in the second blocks and forming the second stepped contacts in the second regions include the following steps. A plurality of first conductive plugs are formed in the second blocks. Each of the first conductive plugs is electrically connected to the first semiconductor layers of the $i+1^{th}$ stack structure and the $i+2^{th}$ stack structure. A plurality of second conductive plugs are formed in the second blocks. Each of the second conductive plugs is electrically connected to the second semiconductor layers of the $i^{th}$ stack structure and the $i+1^{th}$ stack structure. A plurality of third conductive plugs is formed on the first conductive plugs. A plurality of fourth conductive plugs are formed on the second conductive plugs. The first conductive plugs and the third conductive plugs compose the first stepped contacts, and the second conductive plugs and the fourth conductive plugs compose the second stepped contacts.

In an embodiment of the invention, the method further includes the following steps. A spacer is formed on each of the word lines and the lateral surface of each of the stack structures. Before removing the part of the stack structures in the second blocks, a part of the spacers on the second blocks is removed. A liner layer and a first dielectric layer are forming on the substrate. A part of the first dielectric layer and a part of the liner layer are removed to form a plurality of first contact openings in the second blocks. Each of the first contact openings exposes the first semiconductor layers of the $i+1^{th}$ stack structure and the $i+2^{th}$ stack structure. A plurality of second contact openings is formed in the second regions. Each of the second contact opening exposes the second semiconductor layers of the $i^{th}$ stack structure and the $i+1^{th}$ stack structure. The first conductive plugs and the second conductive plugs are formed in the first contact openings and the second contact openings, respectively. A second dielectric layer is formed on the substrate. A part of the second dielectric layer is removed to form a plurality of third contact openings in the second blocks. Each of the third contact openings is disposed between the $i+1^{th}$ stack structure and the $i+2^{th}$ stack structure and exposes the corresponding first conductive plugs. A plurality of fourth contact openings are formed in the second regions. Each of the fourth contact openings is disposed between the $i^{th}$ stack structure and the $i+1^{th}$ stack structure and exposes the corresponding second conductive plugs.

The third conductive plugs and the fourth conductive plugs are formed in the third contact openings and the fourth contact openings, respectively.

In an embodiment of the invention, each of the first conductive lines is disposed between the $i+1^{th}$ stack structure and the $i+2^{th}$ stack structure, and each of the second conductive lines is disposed between the $i^{th}$ stack structure and the $i+1^{th}$ stack structure.

In an embodiment of the invention, the step of forming the stack structures includes the following steps. The first semiconductor layer is formed on the substrate. A first barrier layer is formed on the first semiconductor layer. A body layer is formed on the first barrier layer. A second barrier layer is formed a on the body layer. The second semiconductor layer is formed on the second barrier layer. The second semiconductor layer, the second barrier layer, the body layer, the first barrier layer and the first semiconductor layer are patterned to form the stack structures.

The invention provides a memory device, which includes a substrate, a plurality of stack structures, a plurality of word lines, a charge storage layer, a plurality of first stepped contacts, a plurality of second stepped contacts, a plurality of first conductive lines and a plurality of second conductive lines. The substrate includes a plurality of first blocks and a plurality of second blocks. The first blocks and the second blocks are alternated to each other. Each of the first blocks includes two first regions and a second region, and the second region is disposed between the two first regions. The stack structures are disposed on the substrate. Each of the stack structures extends in a first direction. Each of the stack structures includes: a first semiconductor layer, disposed above a part of the substrate in the first blocks and the second blocks; and a second semiconductor layer, disposed above a part of the substrate in the first blocks and above the first semiconductor layer. The word lines are disposed on the substrate of each of the first regions, each of the word lines extends in a second direction and covers a part of a lateral surface and a part of a top surface of each of the stack structures, and the first direction are different from the second direction. The charge storage layer is disposed between the stack structures and the word lines. The first stepped contacts are disposed in the second blocks, a bottom surface of each of the first stepped contacts is electrically connected to the first semiconductor layers of a $i+1^{th}$ stack structure and a $i+2^{th}$ stack structure, and an area of a top surface of each of the first stepped contacts is less than an area of the bottom surface thereof, wherein i is an odd number. The second stepped contacts are disposed in the second regions, a bottom surface of each of the second stepped contacts is electrically connected to the second semiconductor layers of a $i^{th}$ stack structure and the $i+1^{th}$ stack structure, and an area of a top surface of each of the second stepped contacts is less than an area of the bottom surface thereof. The first conductive lines and the second conductive lines are alternated to each other and disposed on the substrate. Each of the first conductive lines extends in the first direction and is electrically connected to the top surfaces of the first stepped contacts of the first semiconductor layers of the $i+1^{th}$ stack structure and the $i+2^{th}$ stack structure. Each of the second conductive lines extends in the first direction and is electrically connected to the top surfaces of the second stepped contacts of the second semiconductor layers of the $i^{th}$ stack structure and the $i+1^{th}$ stack structure.

In an embodiment of the invention, the first stepped contacts include: a plurality of first conductive plugs, disposed in the second blocks, and each of the first conductive plugs being electrically connected to the first semiconductor layers of the $i+1^{th}$ stack structure and the $i+2^{th}$ stack structure; and a plurality of third conductive plugs, disposed on the first conductive plugs, wherein an area of a top surface of each of the third conductive plugs is less than an area of a bottom surface of the corresponding first conductive plug. The second stepped contacts include: a plurality of second conductive plugs, disposed in the second regions, and each of the second conductive plugs being electrically connected to the second semiconductor layers of the $i^{th}$ stack structure and the $i+1^{th}$ stack structure; and a plurality of fourth conductive plugs, disposed on the second conductive plugs, wherein an area of a top surface of each of the fourth conductive plugs is less than an area of a bottom surface of the corresponding second conductive plug.

In an embodiment of the invention, a width of each of the first conductive lines is less than a width of the bottom surface of any one of the corresponding first conductive plugs, and a width of each of the second conductive lines is less than a width of the bottom surface of any one of the corresponding second conductive plugs.

In an embodiment of the invention, each of the first conductive lines is disposed between the $i+1^{th}$ stack structure and the $i+2^{th}$ stack structure, and each of the second conductive lines is disposed between the $i^{th}$ stack structure and the $i+1^{th}$ stack structure.

In an embodiment of the invention, each of the stack structures includes: a body layer, disposed between the first semiconductor layer and the second semiconductor layer of the first blocks; a first barrier layer, disposed between the body layer and the first semiconductor layer; and a second barrier layer, disposed between the body layer and the second semiconductor layer.

The invention provides another memory device, which includes a substrate, a plurality of stack structures, a plurality of first stepped contacts, a plurality of second stepped contacts, a plurality of first bit lines and a plurality of second bit lines. The substrate includes a first block and a second block. The stack structures are disposed in parallel on the substrate, wherein each of the stack structures extends in a first direction, and each of the stack structures includes: a first semiconductor layer, disposed above a part of the substrate in the first block and the second block; and a second semiconductor layer, disposed above a part of the substrate in the first block and above the first semiconductor layer.

The first stepped contacts are disposed in the second block, extending in a second direction to form a row. The first direction is different from the second direction. Each of the first stepped contacts is electrically connected to the first semiconductor layers of a $i+1^{th}$ stack structure and a $i+2^{th}$ stack structure, and an area of a top surface of each of the first stepped contacts is less than an area of the bottom surface thereof, wherein i is an odd number. The second stepped contacts are disposed in the first block, extending in the second direction to form a row, each of the second stepped contacts being electrically connected to the second semiconductor layers of a $i^{th}$ stack structure and the $i+1^{th}$ stack structure, and an area of a top surface of each of the second stepped contacts being less than an area of the bottom surface thereof. The first bit lines and the second bit lines are alternated to each other and disposed on the substrate. Each of the first bit lines extends in the first direction and is electrically connected to the first stepped contacts electrically connected to the first semiconductor layers of the $i+1^{th}$ stack structure and the $i+2^{th}$ stack structure. Each of the second bit lines extends in the first direction and is electrically connected to the second stepped contacts electrically connected to the second semiconductor layers of the $i^{th}$ stack structure and the $i+1^{th}$ stack structure.

In an embodiment of the invention, the first stepped contacts includes a plurality of first conductive plugs, disposed in the second block, and each of the first conductive plugs being electrically connected to the first semiconductor layers of the $i+1^{th}$ stack structure and the $i+2^{th}$ stack structure; and a plurality of third conductive plugs, disposed on the first conductive plugs. The second stepped contacts includes: a plurality of second conductive plugs, disposed in the first block, and each of the second conductive plugs being electrically connected to the second semiconductor layers of the $i^{th}$ stack structure and the $i+1^{th}$ stack structure; and a plurality of fourth conductive plugs, disposed on the second conductive plugs.

In an embodiment of the invention, an area of a top surface of each of the third conductive plugs is less than an area of a bottom surface of the corresponding first conductive plug, and an area of a top surface of each of the fourth conductive plugs is less than an area of a bottom surface of the corresponding second conductive plug.

In an embodiment of the invention, a width of each of the first bit lines is less than a width of the bottom surface of any one of the corresponding first conductive plugs, and a width of each of the second bit lines is less than a width of the bottom surface of any one of the corresponding second conductive plugs.

In an embodiment of the invention, each of the first bit lines is disposed between the $i+1^{th}$ stack structure and the $i+2^{th}$ stack structure, and each of the second bit lines is disposed between the $i^{th}$ stack structure and the $i+1^{th}$ stack structure.

In an embodiment of the invention, each of the stack structures includes: a body layer, disposed between the first semiconductor layer and the second semiconductor layer of the first block; a first barrier layer, disposed between the body layer and the first semiconductor layer; and a second barrier layer, disposed between the body layer and the second semiconductor layer.

In an embodiment of the invention, the memory device further includes: a plurality of word lines, disposed on the substrate between the first stepped contacts and the second stepped contacts, each of the word lines extending in the second direction and covering a part of a lateral surface and a part of a top surface of each of the stack structures; and a charge storage layer, disposed between the stack structures and the word lines.

Based on above, by utilizing the bottom surface of the first stepped contacts electrically connected to the first semiconductor layers of the $i+1^{th}$ stack structure and the $i+2^{th}$ stack structure, and utilizing the bottom surface of the second stepped contacts electrically connected to the second semiconductor layers of the $i^{th}$ stack structure and the $i+1^{th}$ stack structure (i is an odd umber), the invention is capable of electrically insulating the first semiconductor layer (e.g., the source) of the stack structure from the semiconductor layer (e.g., the drain). Accordingly, the invention is capable of solving the problem of the layout of the interconnection of the vertical memory device without sacrificing the resistance of the bit line and the chip area.

To make the above features and advantages of the disclosure more comprehensible, several embodiments accompanied with drawings are described in detail as follows.

DESCRIPTION OF THE EMBODIMENTS

FIG. 1A to FIG. 1F are top views illustrating a fabricating process of a memory device according to embodiments of the invention. FIG. 2A to FIG. 2F are cross-sectional views of FIG. 1A to FIG. 1F along line A-A'. FIG. 3A to FIG. 3F are cross-sectional views of FIG. 1A to FIG. 1F along line B-B'. FIG. 4A to FIG. 4F are cross-sectional views of FIG. 1A to FIG. 1F along line C-C'. FIG. 5 is a schematic cross-sectional view of FIG. 1A along line D-D'. FIG. 6A to FIG. 6D are cross-sectional views of FIG. 1C to FIG. 1F along line E-E'. FIG. 7A to FIG. 7C are cross-sectional views of FIG. 1D to FIG. 1F along line F-F'.

Figure 1A:
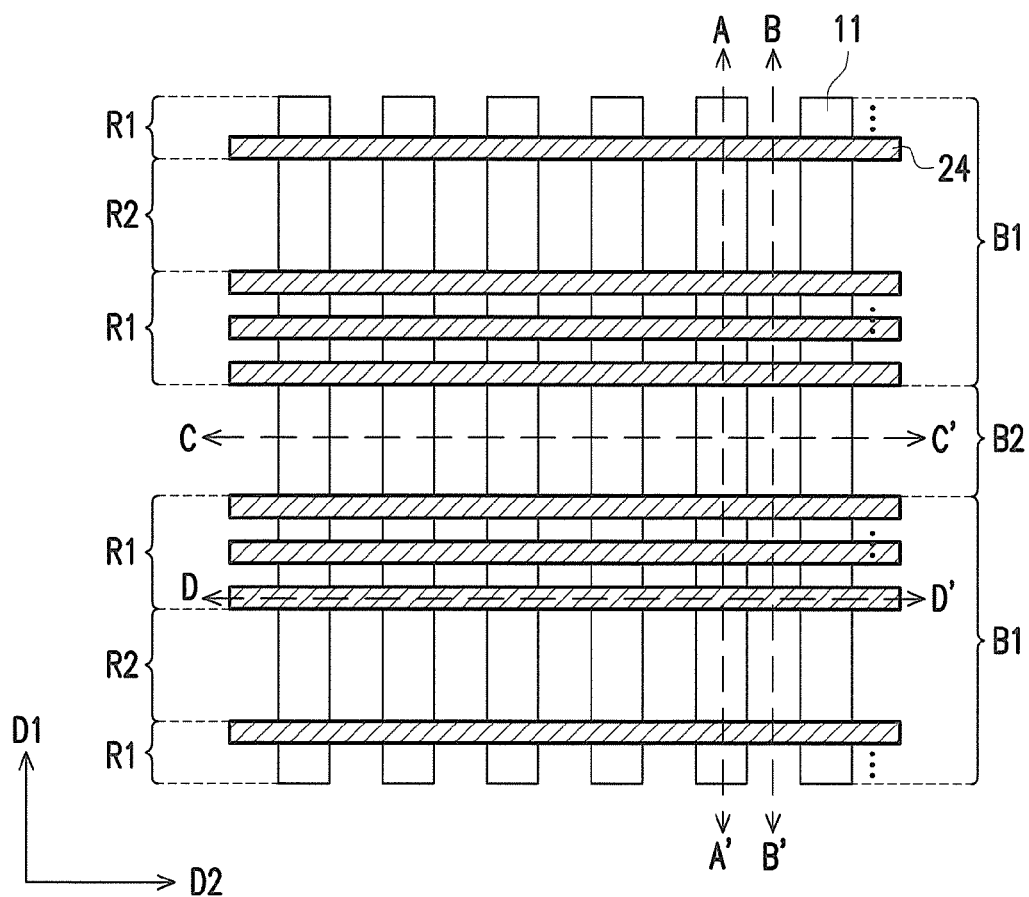
FIG. 1A to FIG. 1F are top views illustrating a fabricating process of a memory device according to embodiments of the invention.
Figure 1B:
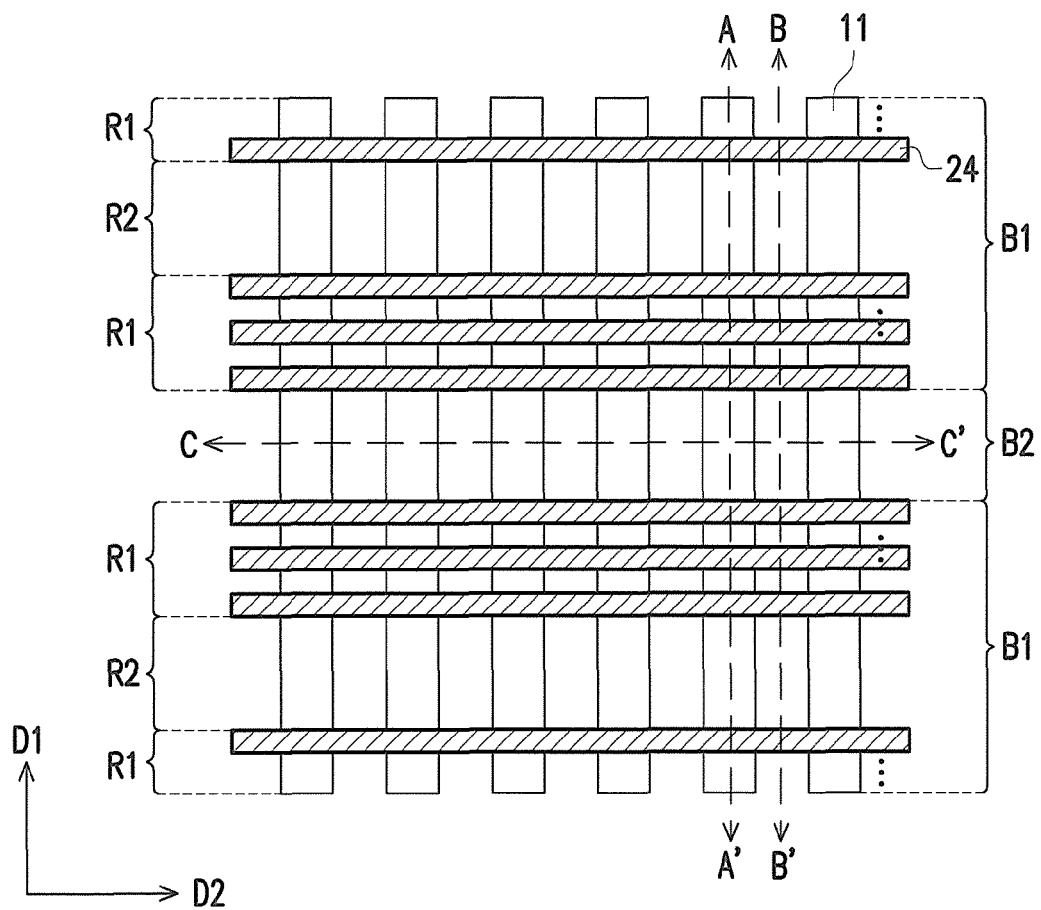
Figure 1C:
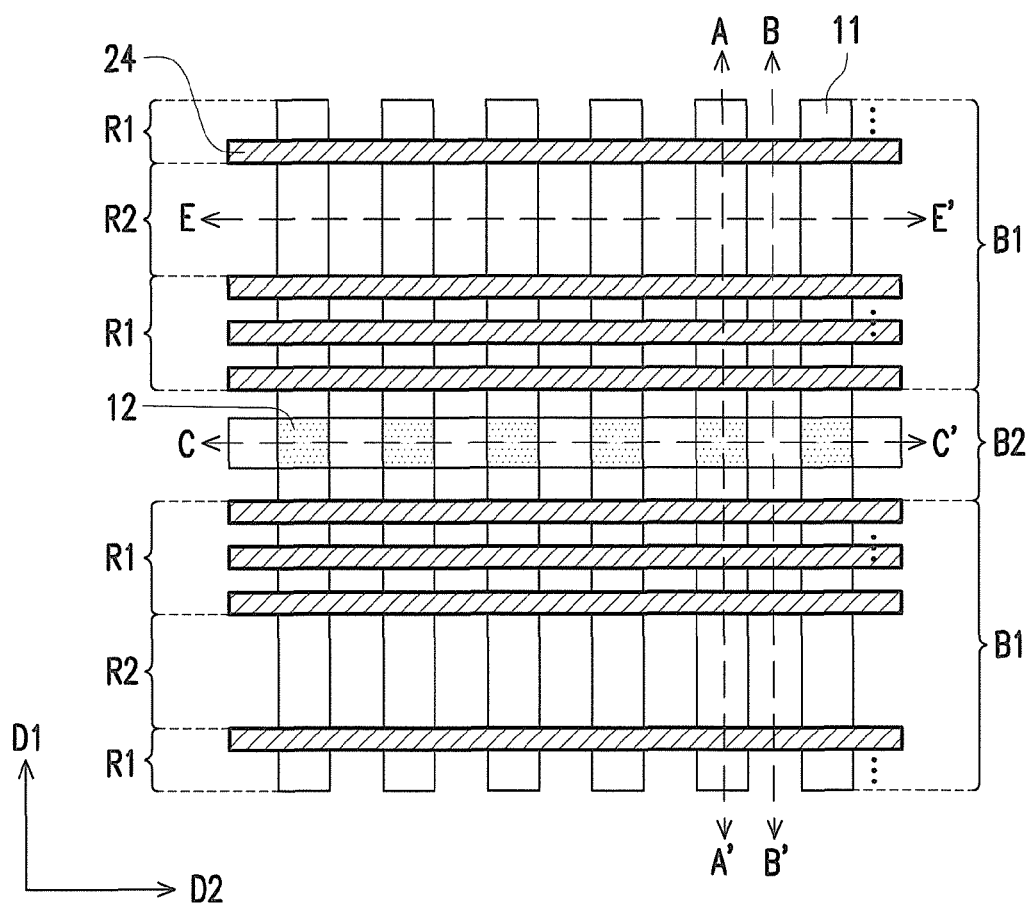

Referring to FIG. 1A, a substrate 10 is provided. The substrate 10 includes a plurality of first blocks B1 and a plurality of second blocks B2. The first blocks B1 and the second blocks B2 are alternated to each other. FIGS. 1A to 1F illustrate that the substrate 10 includes two first blocks B1 and one second block B2. Each of the first blocks B1 includes two first regions R1 and a second region R2. The first regions R1 are respectively adjacent to the second blocks B2, and the second region R2 is disposed between the first regions R1. The substrate 10 is, for example, a semiconductor substrate, a semiconductor compound substrate, or a semiconductor over insulator (SOI). The semiconductor substrate is, for example, atoms in group IVA, such as silicon or germanium. The semiconductor compound is, for example, a semiconductor compound formed by atoms in group IVA, such as silicon germanium or silicon carbide, or a semiconductor compound formed by atoms in group IIIA and group VA (e.g., gallium arsenide).

Referring to FIG. 1A, FIG. 2A, FIG. 3A, FIG. 4A and FIG. 5, a plurality of stack structures 11 are formed on the substrate 10. Each of the stack structures 11 extends in a first direction D1. In another embodiment, the stack structure 11 successively includes a first semiconductor layer 12, a body layer 16 and a second semiconductor layer 20. The first semiconductor layer 12/the body layer 16/the second semiconductor layer 20 is, for example, served as a source/a body/a drain. The first semiconductor layer 12 and the second semiconductor layer 20 may be a first conductivity type doped layer; and the body layer 16 may be a second conductivity type doped layer. In an exemplary embodiment, the first semiconductor layer 12/the body layer 16/the second semiconductor layer 20 may be, for example, a N+/P/N+ doped layer, a P+/N/P+ doped layer or a SiGe/Si/SiGe layer. In another embodiment, the stack structure 11 successively includes the first semiconductor layer 12, a first barrier layer 14, the body layer 16, a second barrier layer 18 and the second semiconductor layer 20. Thicknesses of the first barrier layer 14 and the second barrier layer 18 must be enough for blocking dopant diffusion in the first semiconductor layer 12, the body layer 16 and the second semiconductor layer 20, but charges can directly tunnel the first barrier layer 14 and the second barrier layer 18. In an embodiment of the invention, materials of the first barrier layer 14 and the second barrier layer 18 include, for example, oxide, nitride or oxynitride. The materials of the first barrier layer 14 and the second barrier layer 18 may be the same or different materials. For instance, the thicknesses of the first barrier layer 14 and the second barrier layer 18 may be, for example, 10 angstroms to 20 angstroms. In an embodiment, a method of forming the stack structures 11 includes the following steps. A semiconductor material layer, a barrier material layer, a body material layer, another barrier material layer and another semiconductor material layer are formed first. Then, a photolithographic process is performed to form the stack structures 11. The semiconductor material layer, the barrier material layer, the body material layer, the another barrier material layer and the another semiconductor material layer may be formed by chemical vapor deposition or physical vapor deposition.

Thereafter, a charge storage layer 22 is formed on the substrate 10. The charge storage layer 22 is conformally formed on a top surface and a lateral surface of the stack structure 11. In the memory device of the invention, the charge storage layer 22 is disposed on the top surface and the lateral surface of the stack structure 11. Accordingly, in addition to a charge storage function, the charge storage layer 22 may also provide effects of electrically insulating the first semiconductor layer 12 and the second semiconductor layer 20 from a word line 24 (as depicted FIG. 5) in subsequent process. In an embodiment, the charge storage layer 22 is, for example, a composite layer composed of Oxide-Nitride-Oxide (ONO). Such composite layer may include three or more layers, but the invention is not limited thereto. A method of forming the composite layer includes chemical vapor deposition, thermal oxidation and so on.

Next, a word line material layer (not illustrated) is formed on the charge storage layer 22, the word line material layer is conformally formed on a top surface and a lateral surface of the charge storage layer 22. Next, the word line material layer is patterned to form a plurality of word lines 24 (e.g., served as control gates) which expose a top surface of the charge storage layer 22. Each of the word lines 24 extends in a second direction D2 and covers a part of the lateral surface and a part of the top surface of each charge storage layer 22 in the first regions R1. In an embodiment, the first direction D1 is different from the second direction D2. In an exemplary embodiment, the first direction D1 is substantially perpendicular to the second direction D2.

As shown in FIG. 5, two lateral surfaces of the stack structure 11 are covered by the word line 24. Accordingly, the word line 24 is capable of controlling operations of the memory device of the invention by utilizing the lateral surfaces of the stack structure 11, and a double-surface control of the memory device of the invention utilizing the lateral surfaces of the stack structure 11 makes the operations of the memory device more accurate as compared to a single-surface control.

Referring to FIG. 1B, FIG. 2B, FIG. 3B and FIG. 4B together, a spacer 26 is respectively formed on each of the word lines 24 and the lateral surfaces of each of the stack structures 11. More specifically, a spacer material layer (not illustrated) is conformally formed on the substrate 10 to cover the stack structures 11. A material of the spacer material layer may be, for example, a silicon oxide, a silicon nitride or a combination thereof, and a method of forming the same may include chemical vapor deposition. Then, an anisotropic etching process is performed to remove a part of the spacer material layer, so as to form the spacer 26 on each of the word lines 24 and the lateral surfaces of each of the stack structures 11, respectively.

Figure 2A:
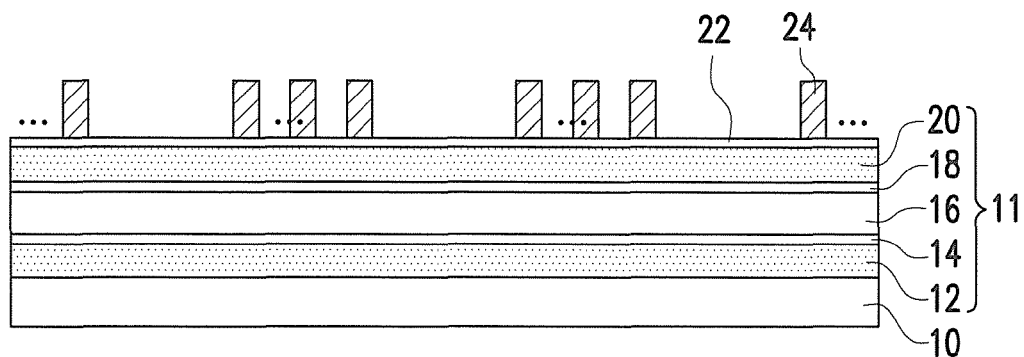
FIG. 2A to FIG. 2F are cross-sectional views of FIG. 1A to FIG. 1F along line A-A'.
Figure 2B:
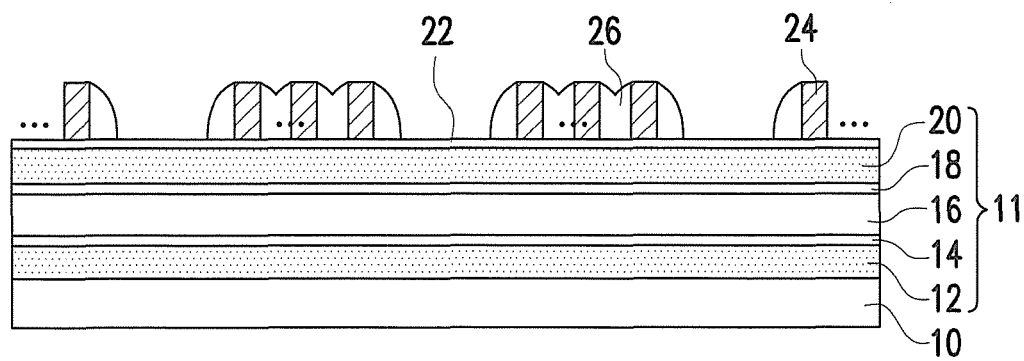
Figure 2C:
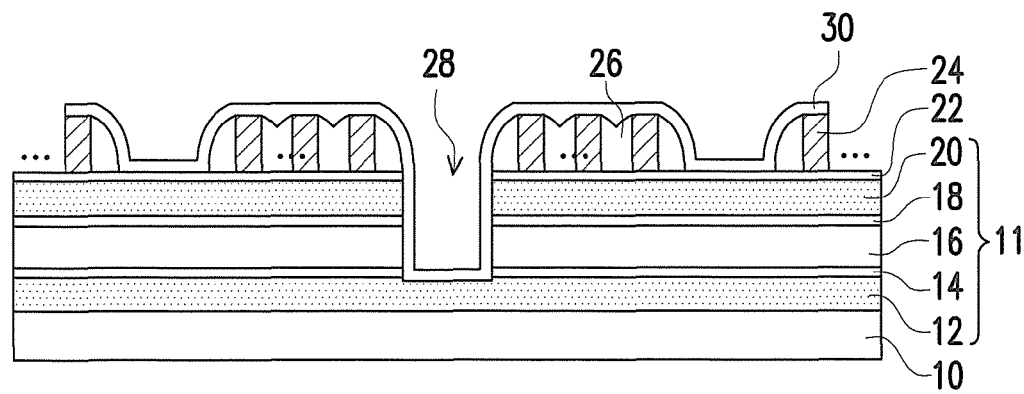
Figure 2D:
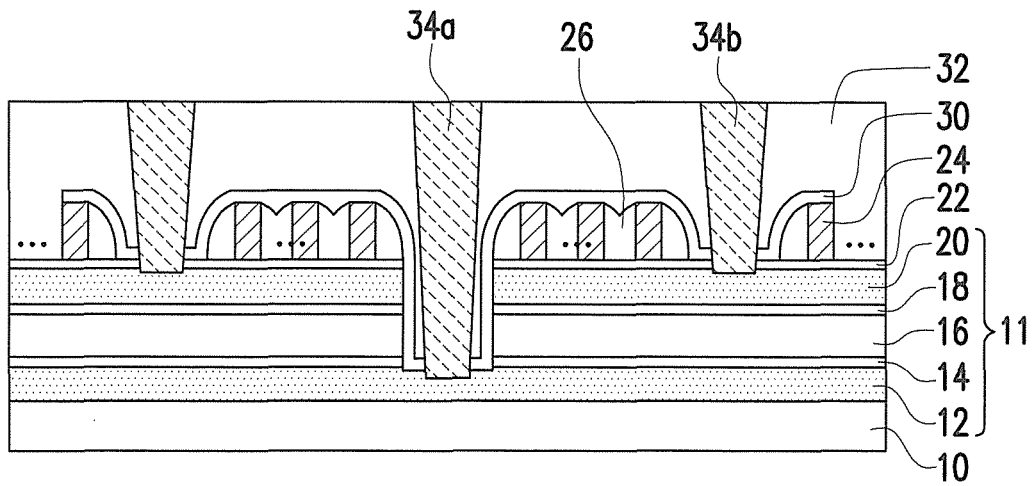
Figure 2E:
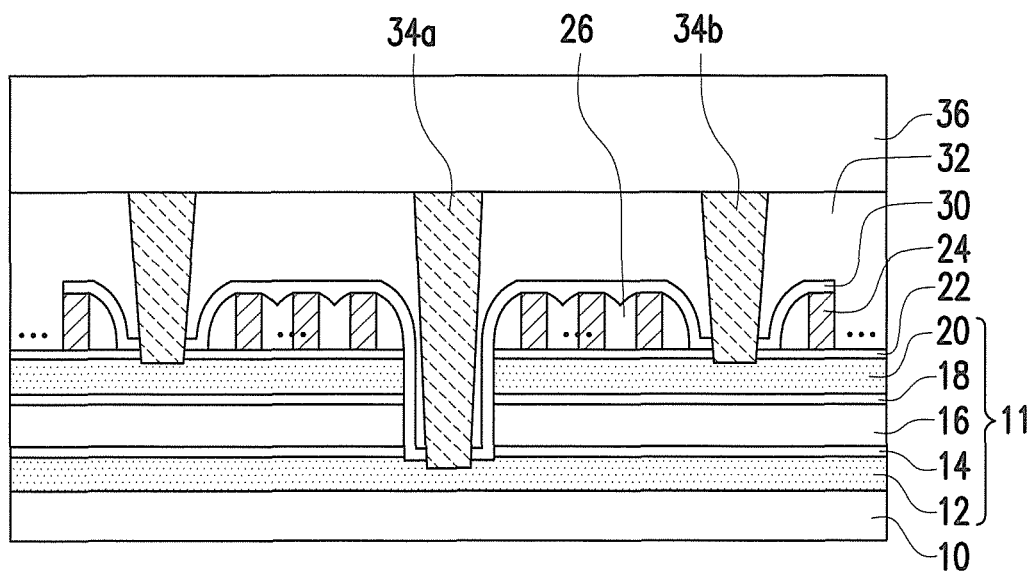
Figure 2F:
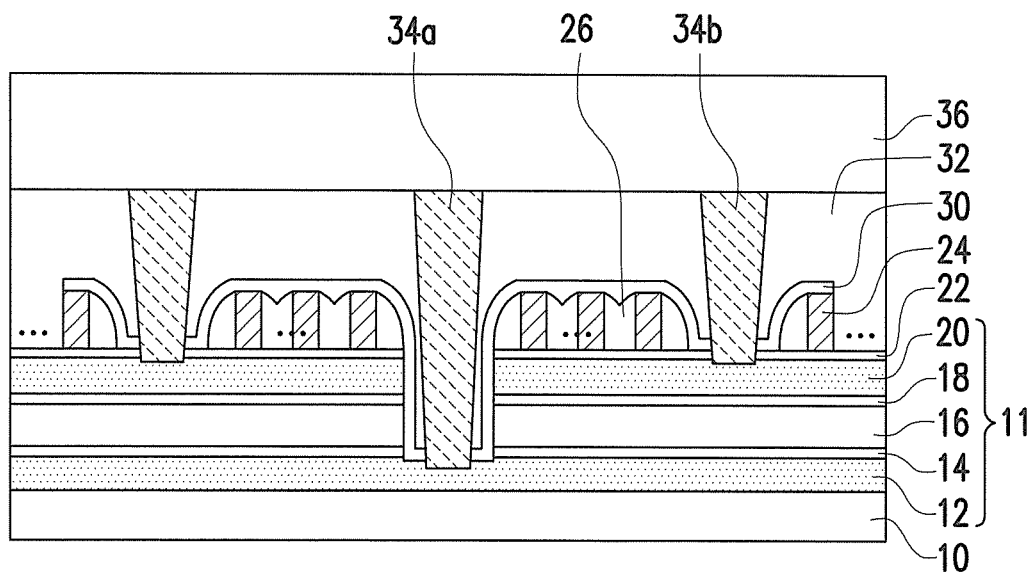
Figure 3A:
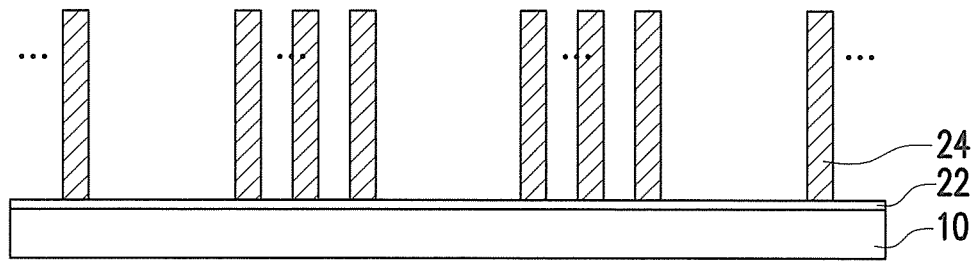
FIG. 3A to FIG. 3F are cross-sectional views of FIG. 1A to FIG. 1F along line B-B'.
Figure 3B:
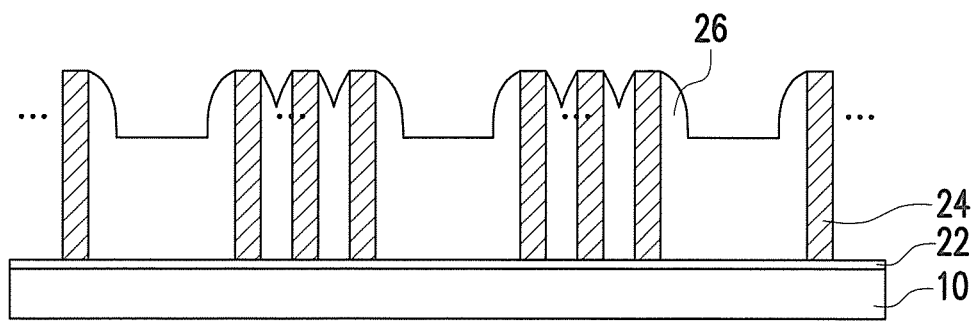
Figure 3C:
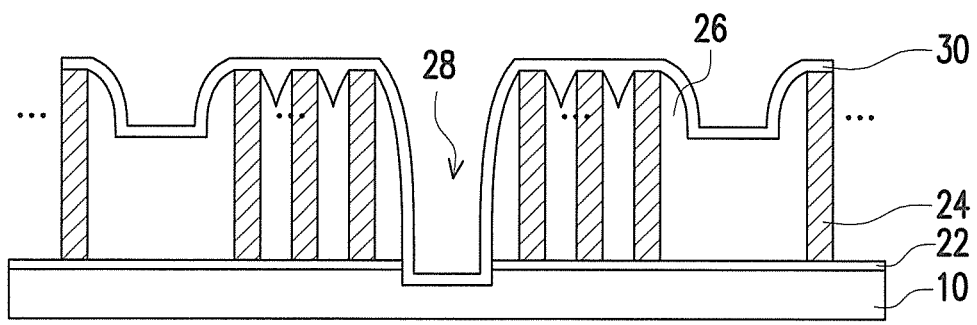
Figure 3D:
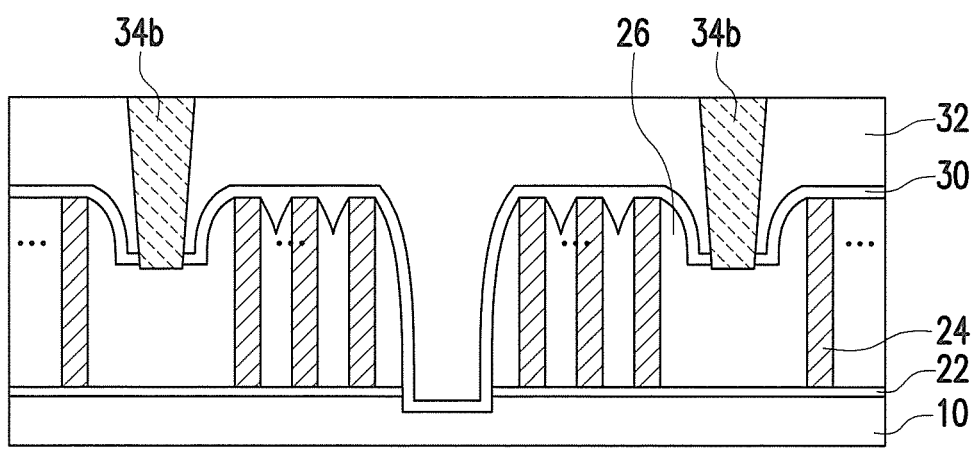
Figure 3E:
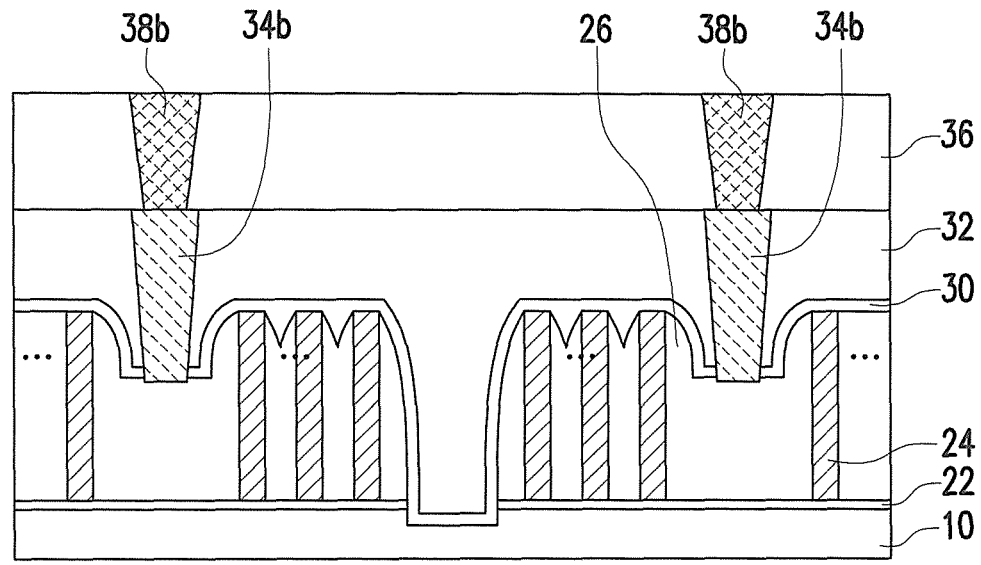
Figure 3F:
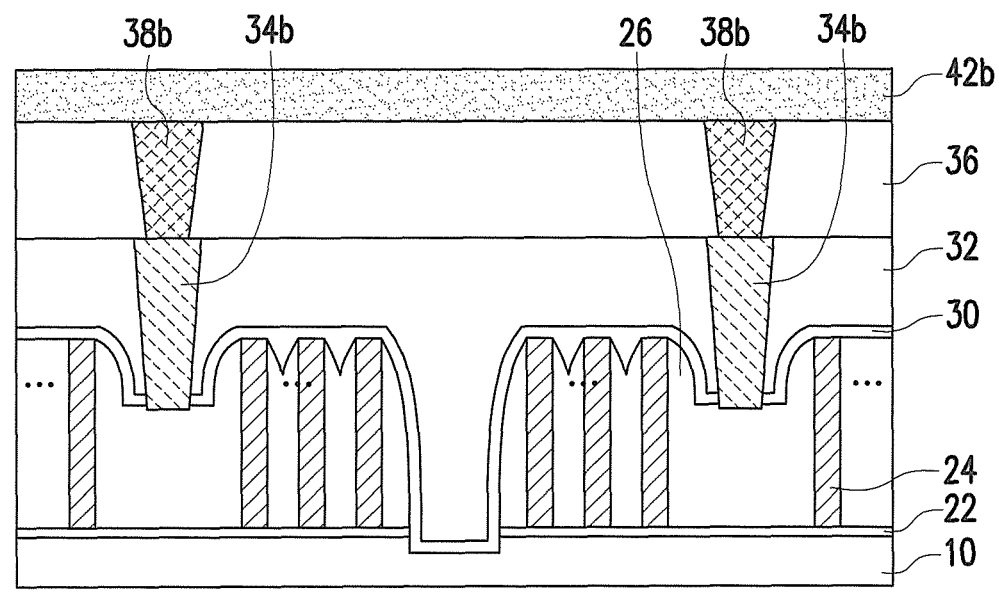

Referring to FIG. 1C, FIG. 2C, FIG. 3C, FIG. 4C and FIG. 6A, a photolithographic process and an etching process are performed to remove a part of the stack structure 11 and a part of the spacer 26 on the second blocks B2, so as to form a trench 28 (as shown in FIG. 2C and FIG. 3C) to expose the first semiconductor layer 12 (as shown in FIG. 2C to FIG. 4C). Next, a liner layer 30 is conformally formed on the substrate 10 to cover the stack structures 11 and the word lines 24. A material of the liner layer 30 is, for example, a silicon oxide, a silicon oxynitride, a silicon nitride or a combination thereof. The liner layer 30 may be formed by chemical vapor deposition or physical vapor deposition.

Figure 1D:
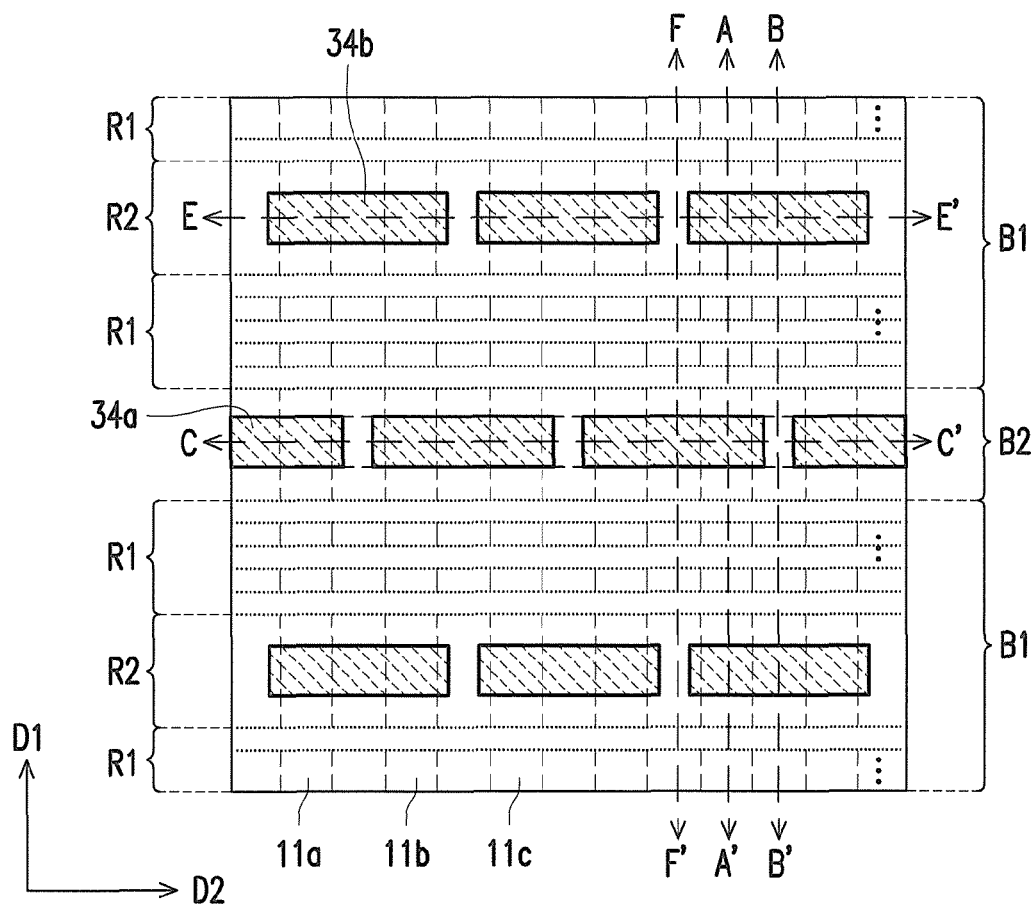
Figure 1E:
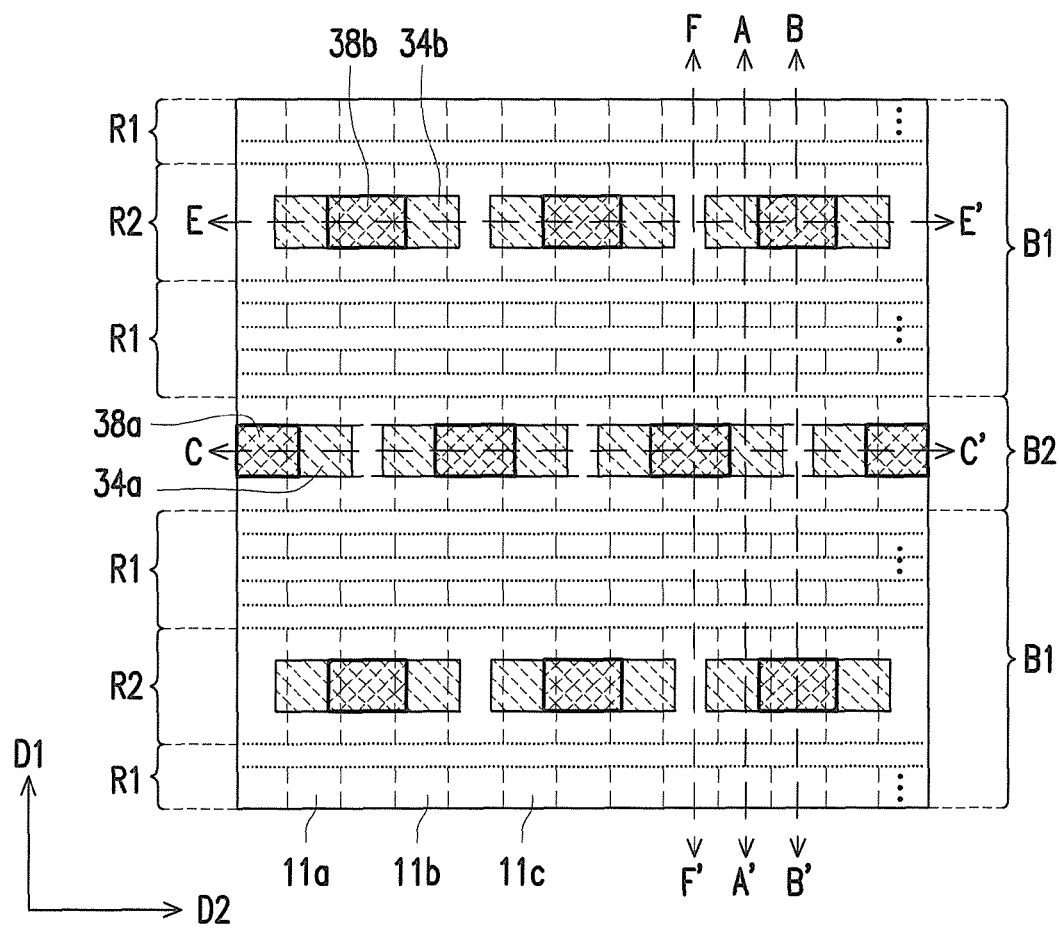
Figure 4A:
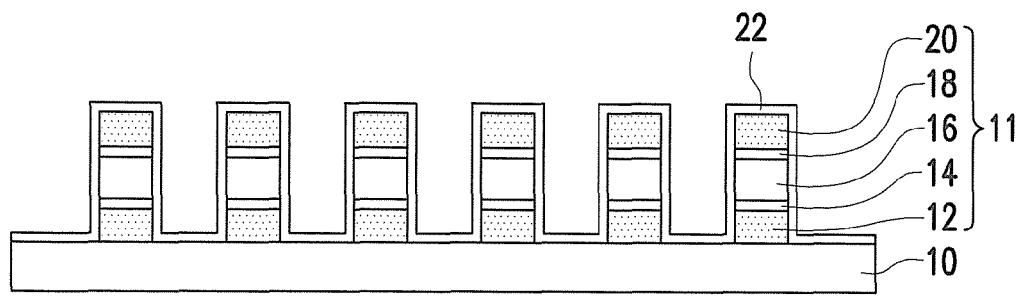
FIG. 4A to FIG. 4F are cross-sectional views of FIG. 1A to FIG. 1F along line C-C'.
Figure 4B:
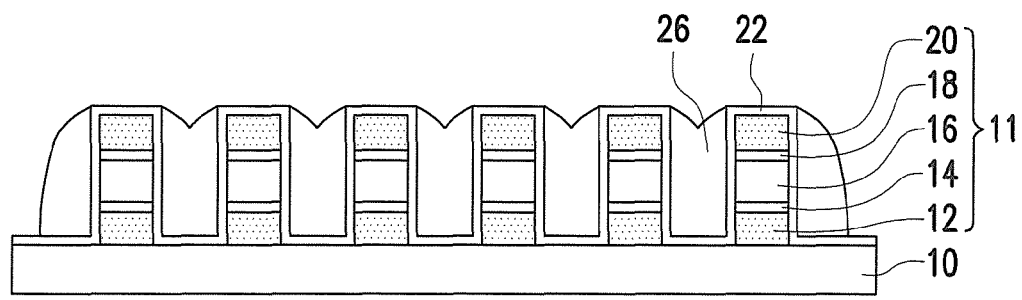
Figure 4C:
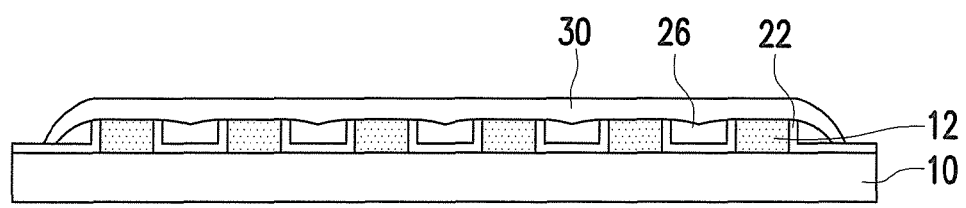
Figure 4D:
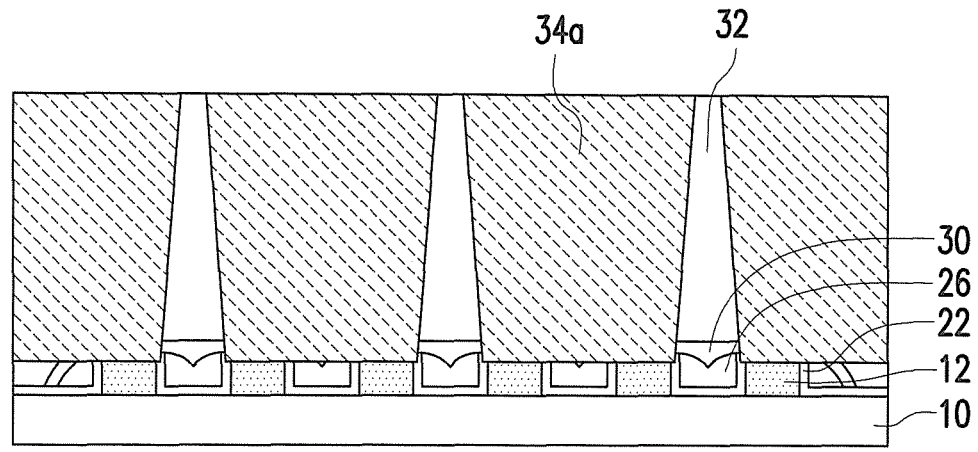
Figure 5:
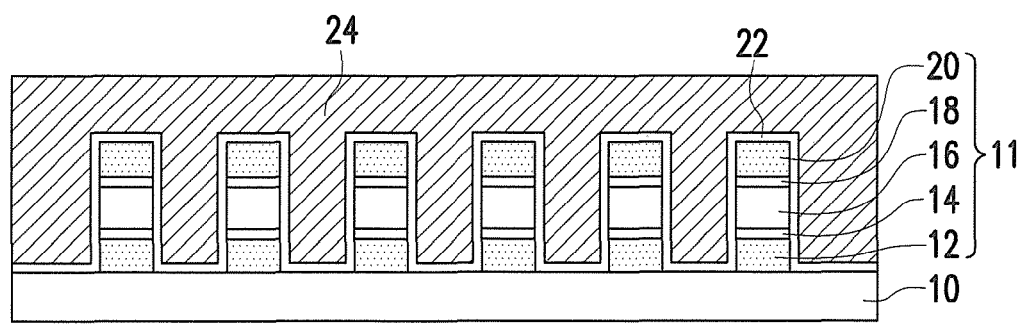
FIG. 5 is a schematic cross-sectional view of FIG. 1A along line D-D'.

Referring to FIG. 1D, FIG. 2D, FIG. 3D, FIG. 4D, FIG. 6B and FIG. 7A, a dielectric layer 32 is formed on the substrate 10. Next, a photolithography process and an etching process are performed to remove a part of the dielectric layer 32 and a part of the liner layer 30, so as to form a plurality of first contact openings 33a in the second blocks B2 and form a plurality of second contact openings 33b in the second regions R2. Each of the first contact openings 33a exposes the semiconductor layers 12 of an i+1$^{th}$ stack structure 11b and an i+2$^{th}$ stack structure 11c (FIGS. 1D and 4D). Each of the second contact openings 33b exposes the semiconductor layers 20 of an i$^{th}$ stack structure 11a and the i+1$^{th}$ stack structure 11c (FIGS. 1D and 6B). i is an odd number. Because the liner layer 30 conformally covers the stack structures 11 and the word lines 24, even if a misalignment occurs while forming the first contact opening 33a and the second contact openings 33b, the liner layer 30 is able to protect the stack structures 11 and the word lines 24 from being damaged by etching which causes contacts (which are formed subsequently) to short with the stack structures 11 and the word lines 24.

Thereafter, first conductive plugs 34a and second conductive plugs 34b are formed in the first contact openings 33a and the second contact openings 33b, respectively. Each of the first conductive plugs 34a is electrically connected to the semiconductor layers 12 of the i+1$^{th}$ stack structure 11b and the i+2$^{th}$ stack structure 11c; and each of the second conductive plugs 34b is electrically connected to the semiconductor layers 20 of the i$^{th}$ stack structure 11a and the i+1$^{th}$ stack structure 11b. i is an odd number. For instance, when i is 1, each of the first conductive plugs 34a is electrically connected to the semiconductor layers 12 of a 2$^{nd}$ stack structure 11b and a 3$^{rd}$ stack tack structure 11c; and each of the second conductive plugs 34b is electrically connected to the semiconductor layers 20 of a 1$^{st}$ stack structure 11a and the 2$^{nd}$ stack structure 11b. The rest can be deduced from the above, thus related description thereof is omitted hereinafter. Because the first conductive plugs 34a and the second conductive plugs 34b are respectively connected to the semiconductor layers 12 and the second semiconductor layer 20, and the first conductive plugs 34a and the second conductive plugs 34b are electrically insulated from each other through the dielectric layer 32, the semiconductor layers 12 and the semiconductor layers 20 are also electrically insulated from each other. As a result, the semiconductor layers 12 and the semiconductor layers 20 may complete a layout through an interconnection in a cell region without sacrificing the resistance of the bit line and the chip area. A forming method of the first conductive plugs 34a and the second conductive plugs 34b may includes the following steps. For example, a conductive material layer on the substrate 10 is formed first. The conductive material layer may be, for example, tungsten, aluminum, copper or an alloy thereof and may be formed by physical vapor deposition, such as sputtering. Thereafter, a part other than the first contact openings 33a and the second contact openings 33b may be removed by chemical mechanical polishing or etching back.

Referring to FIG. 1E, FIG. 2E, FIG. 3E, FIG. 4E, FIG. 6C and FIG. 7B, a dielectric layer 36 is formed on the substrate 10. Next, a photolithography process and an etching process are performed to remove a part of the dielectric layer 36, so as to form a plurality of third contact openings 37a (FIG. 1E and FIG. 4E) in the second blocks B2, and form a plurality of fourth contact openings 37b (FIG. 1E and FIG. 6C) in the second regions R2. Each of the third contact openings 37a is disposed between the i+1$^{th}$ stack structure 11b and the i+2$^{th}$ stack structure 11c and exposes the corresponding first conductive plug 34a. Each of the fourth contact openings 37b is disposed between the i$^{th}$ stack structure 11a and the i+1$^{th}$ stack structure 11b and exposes the corresponding second conductive plug 34b. Next, third conductive plugs 38a and fourth conductive plugs 38b are formed in the third contact openings 37a and the fourth contact openings 37b, respectively. A forming method of the third conductive plugs 38a and the fourth conductive plugs 38b includes the following step. For example, a conductive material layer on the substrate 10 is formed first. The conductive material layer may be, for example, tungsten, aluminum, copper or an alloy thereof and may be formed by physical vapor deposition, such as sputtering. Thereafter, a part other than the third contact openings 37a and the fourth contact openings 37b is removed by chemical mechanical polishing or etching back.

Figure 4E:
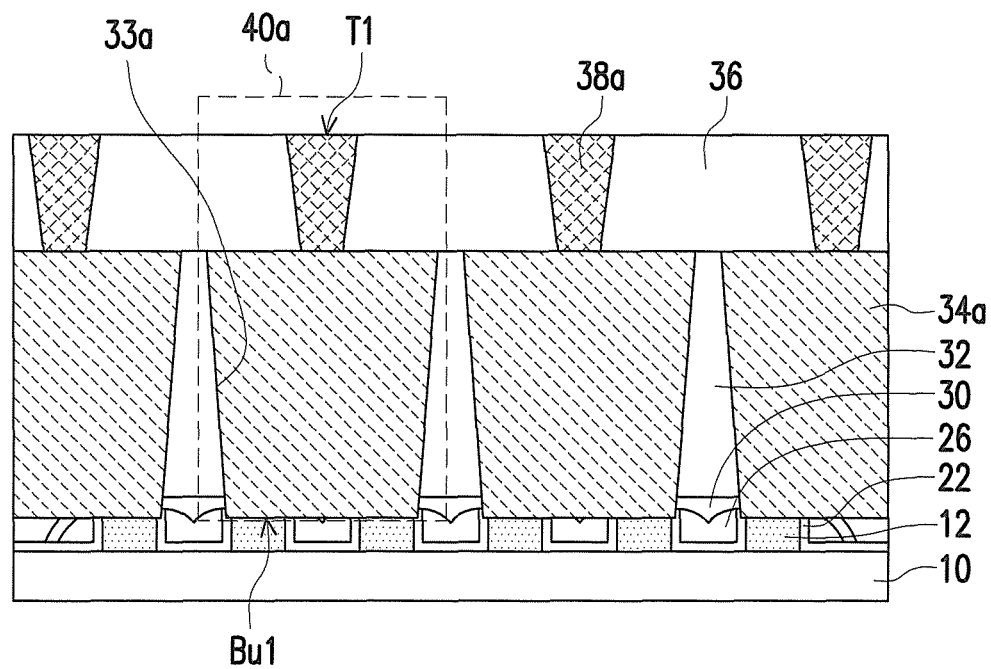
Figure 6A:
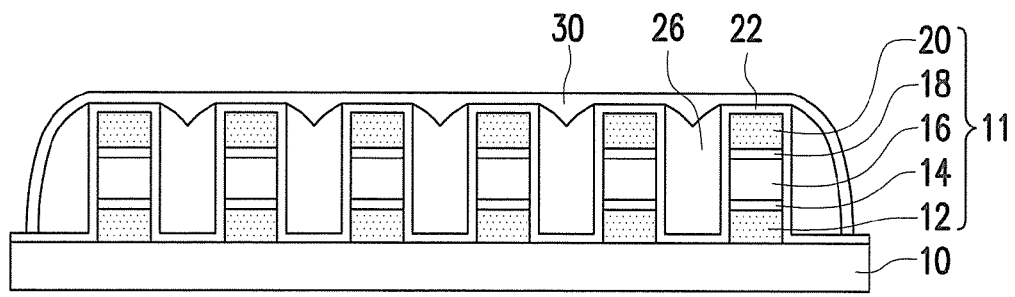
FIG. 6A to FIG. 6D are cross-sectional views of FIG. 1C to FIG. 1F along line E-E'.
Figure 6B:
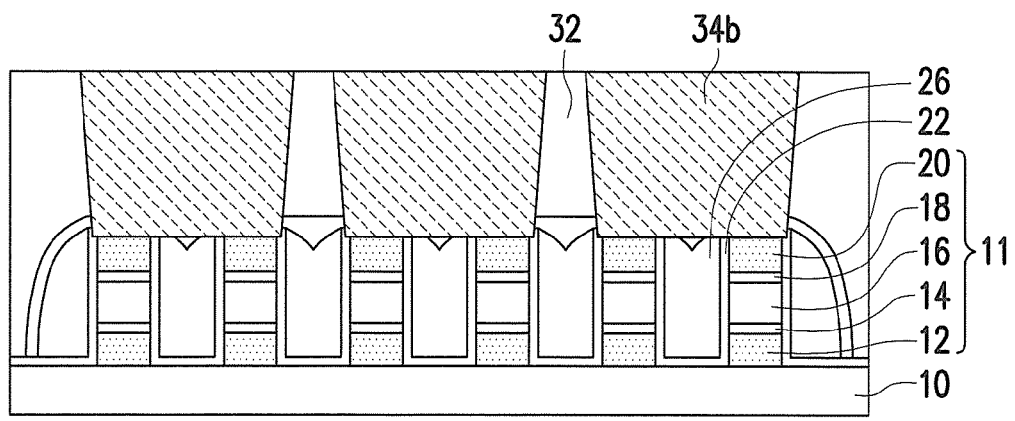
Figure 6C:
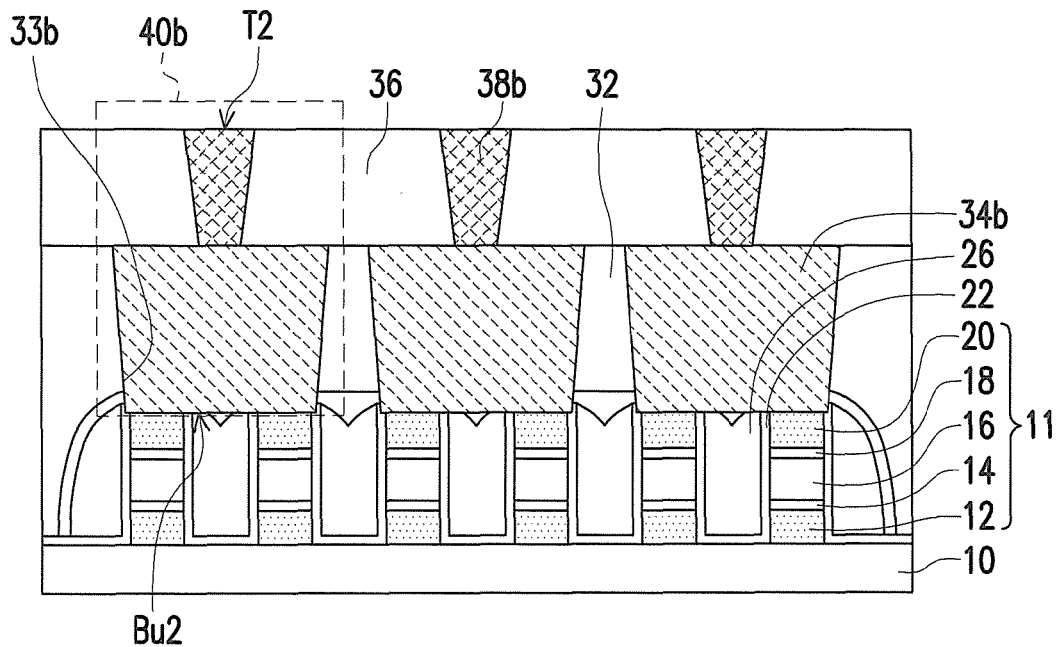
Figure 7A:
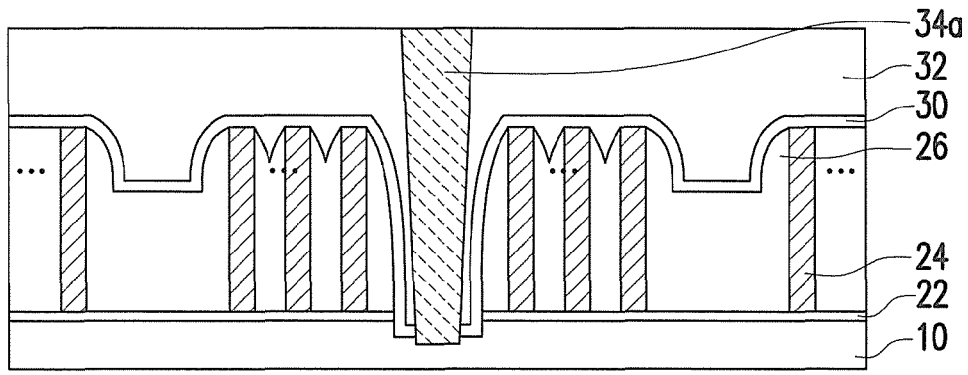
FIG. 7A to FIG. 7C are cross-sectional views of FIG. 1D to FIG. 1F along line F-F'.
Figure 7B:
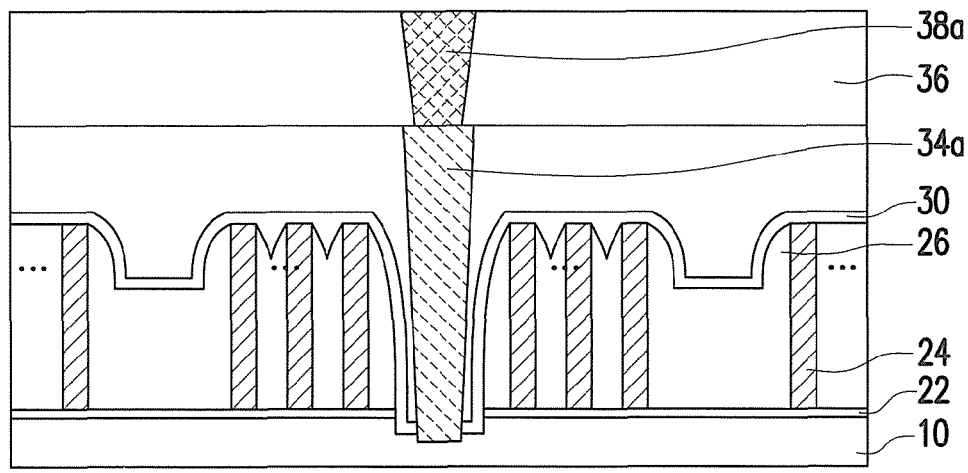
Figure 7C:
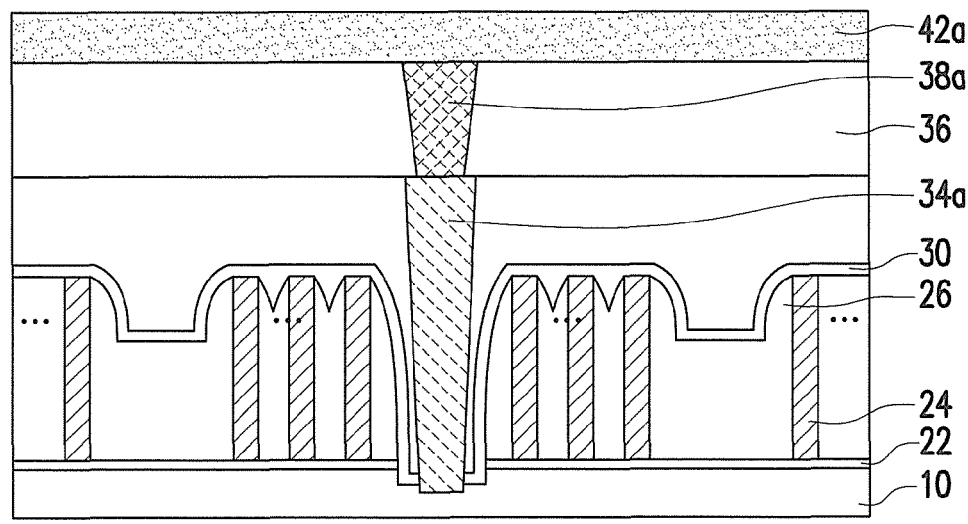

As shown in FIG. 4E and FIG. 6C, the third conductive plug 38a and the first conductive plug 34a compose a first stepped contact 40a. The fourth conductive plug 38b and the second conductive plug 34b compose a second stepped contact 40b. A plurality of the first stepped contacts 40a are disposed in the second blocks B2. A bottom surface Bu1 of each of the first stepped contacts 40a is electrically connected to the semiconductor layers 12 of the i+1$^{th}$ stack structure 11b and the i+2$^{th}$ stack structure 11c, and an area of a top surface T1 of each of the first stepped contacts 40a is less than an area of the bottom surface Bu1 thereof. The second stepped contacts 40b are disposed in the second regions R2. A bottom surface Bu2 of each of the second stepped contacts 40b is electrically connected to the semiconductor layers 20 of the i$^{th}$ stack structure 11a and the i+1$^{th}$ stack structure 11b, and an area of a top surface T2 of each of the second stepped contacts 40b is less than an area of the bottom surface Bu2 thereof.

Referring to FIG. 1F, FIG. 2F, FIG. 3F, FIG. 4F, FIG. 6D an FIG. 7C, a conductive material layer (not illustrated) is formed on the substrate 10. Then, the conductive material layer is patterned to form a plurality of first conductive lines 42a and a plurality of second conductive lines 42b alternated to each other and served as the bit lines. Each of the first conductive lines 42a extends in the first direction D1 and is electrically connected to the top surfaces T1 of the first stepped contacts 40a; and each of the second conductive lines 42b extends in the first direction D1 and is electrically connected to the top surfaces T2 of the second stepped contacts 40b. In other words, each of the first conductive lines 42a is electrically connected to the first semiconductor layer 12 of the i+1$^{th}$ stack structure 11b and the first semiconductor layer 12 of the i+2$^{th}$ stack structure 11c; and each of the second conductive lines 42b is electrically connected to the second semiconductor layer 20 of the i$^{th}$ stack structure 11a and the first semiconductor layer 12 of the i+1$^{th}$ stack structure 11b. Further, each of the first conductive lines 42a is disposed between the i+1$^{th}$ stack structure 11b and the i+2$^{th}$ stack structure 11c, and each of the second conductive lines 42b is disposed between the i$^{th}$ stack structure 11a and the i+1$^{th}$ stack structure 11b. A material of the conductor material layer may be, for example, tungsten, aluminum, copper or an alloy thereof, and a method of forming the same may include physical vapor deposition, such as sputtering. A width W1 of each of the first conductive lines 42a is less than a width W2 of the bottom surface of any one of the corresponding first conductive plugs 34a; and a width W3 of each of the second conductive lines 42b is less than a width W4 of the bottom surface of any one of the corresponding second conductive plugs 34b. As a result, insufficient process window of the conductive lines may be avoided.

Figure 1F:
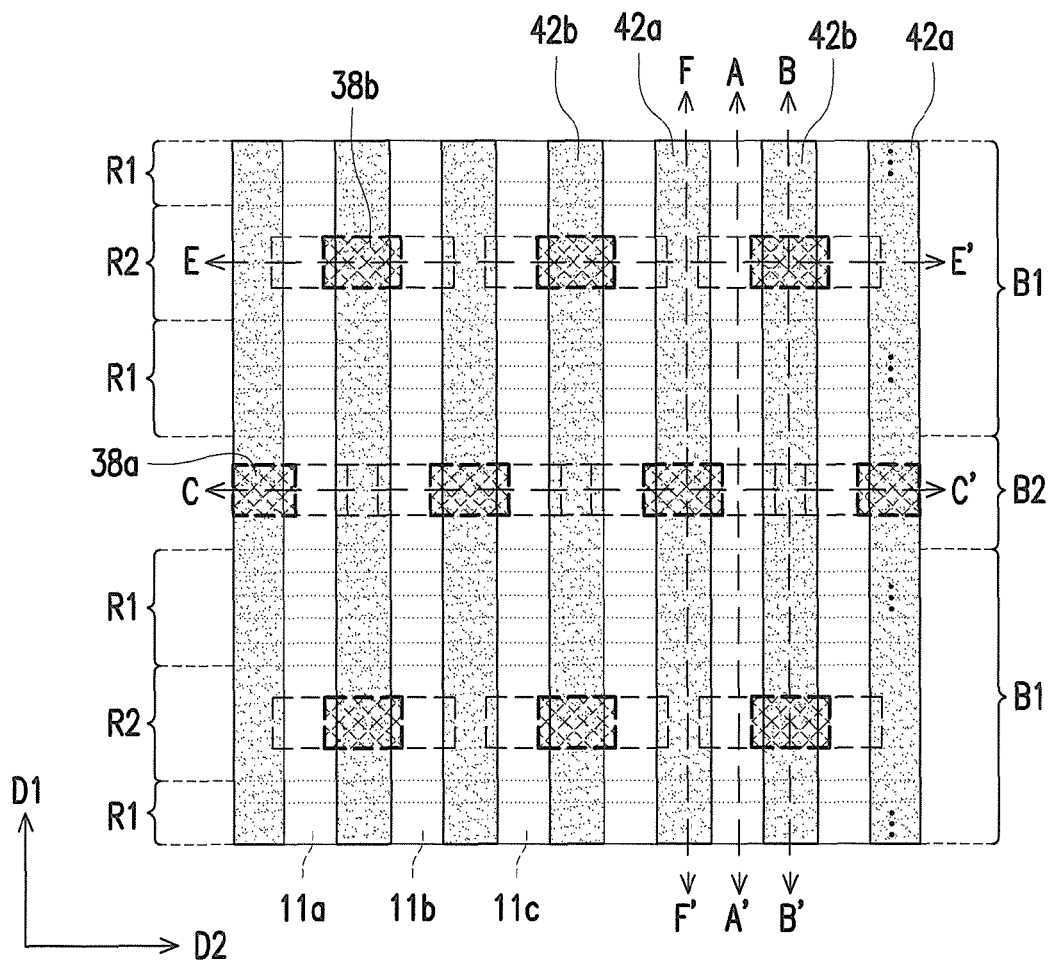
Figure 4F:
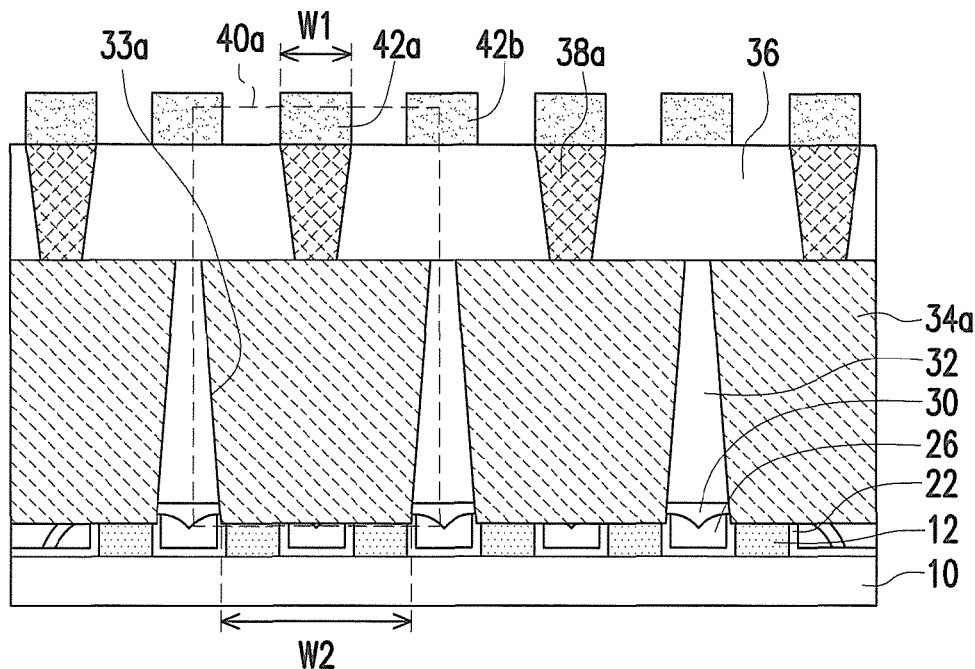
Figure 6D:
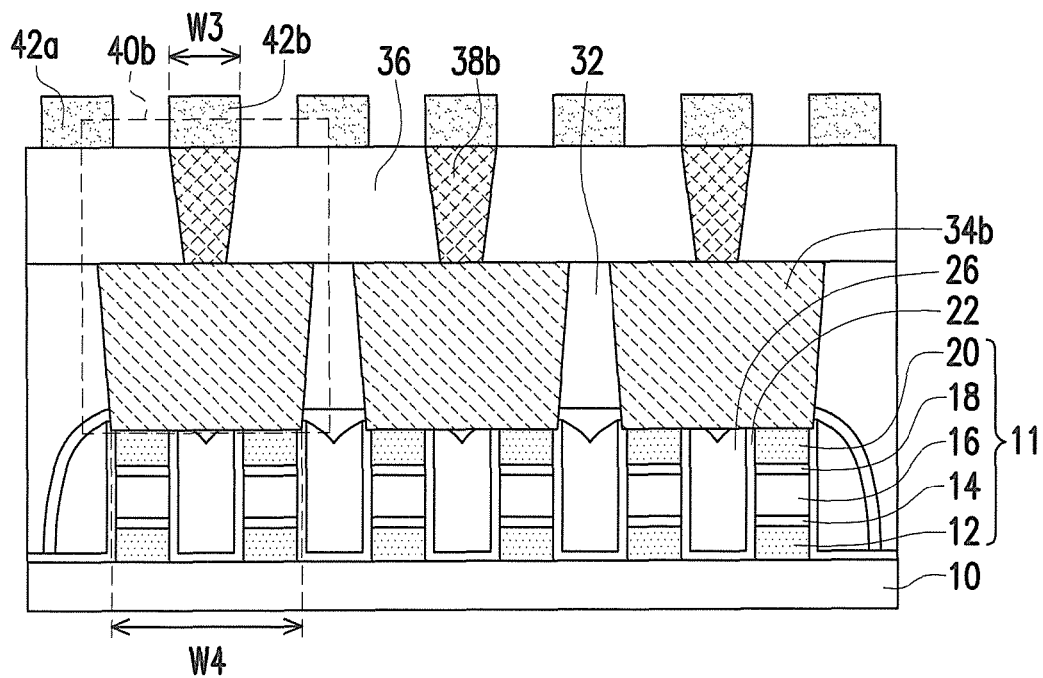

Referring to FIG. 1F, FIG. 4F and FIG. 6D, a memory device according an embodiment of the invention includes: a substrate 10, a plurality of stack structures 11, a plurality of word lines 24, a charge storage layer 22, first stepped contacts 40a, second stepped contacts 40b, a plurality of first conductive lines 42a and a plurality of second conductive lines 42b (e.g., served as bit lines).

Referring to FIG. 1F and FIG. 4F, the substrate 10 includes the plurality of first blocks B1 and the plurality of second blocks B2. The second blocks B2 and the first blocks B1 are alternated to each other. FIG. 1F illustrates that the substrate 10 includes two first blocks B1 and one second block B2. Each of the first blocks B1 includes two first regions R1 and a second region R2. The first regions R1 are respectively adjacent to the second blocks B2, and the second region R2 is disposed between the first regions R1.

Referring to FIG. 6D, the stack structures 11 are disposed on the substrate 10. Each of the stack structures 11 extends in a first direction D1. Each of the stack structures 11 includes a first semiconductor layer 12, a body layer 16 and a second semiconductor layer 20. The first semiconductor layer 12 is disposed above a part of the substrate 10 in the first blocks B1 and the second blocks B2. The second semiconductor layer 20 is disposed above a part of the substrate 10 in the first blocks B1 and above the first semiconductor layer 12. The body layer 16 is disposed between the first semiconductor layer 12 and the second semiconductor layer 20 in the first blocks B1.

Referring to FIGS. 1D and 1F, a plurality of word lines 24 are disposed on the substrate 10 in each of the first regions B1, and each of the word lines 24 extends in a second direction D2 and covers a part of a lateral surface and a part of a top surface of each of the stack structures 11. The first direction D1 is different from the second direction D2. The charge storage layer 22 is disposed between the stack structures 11 and the word lines 24 (as shown in FIG. 5).

Referring to FIG. 4F and FIG. 6D, the first stepped contacts 40a are disposed in the second blocks B2. A bottom surface Bu1 of each of the first stepped contacts 40a is electrically connected to the semiconductor layers 12 of the i+1$^{th}$ stack structure 11b and the i+2$^{th}$ stack structure 11c, and an area of a top surface T1 of each of the first stepped contacts 40a is less than an area of the bottom surface Bu1 thereof, wherein i is an odd number. The second stepped contacts 40b are disposed in the second regions R2. A bottom surface Bu2 of each of the second stepped contacts 40b is electrically connected to the semiconductor layers 20 of the i$^{th}$ stack structure 11a and the i+1$^{th}$ stack structure 11b, and an area of a top surface T2 of each of the second stepped contacts 40b is less than an area of the bottom surface Bu2 thereof. The first conductive lines 42a and the second conductive lines 42b are alternated to each other and disposed on the substrate 10. Each of the first conductive lines 42a extends in the first direction D1 and is electrically connected to the top surfaces T1 of the first stepped contacts 40a (electrically connected to the semiconductor layers 12 electrically connected to the i+1$^{th}$ stack structure 11b and the i+2$^{th}$ stack structure 11c). Each of the second conductive lines 42b extends in the first direction D1 and is electrically connected to the top surfaces T2 of the second stepped contacts 40b (electrically connected to the semiconductor layers 20 electrically connected to the i$^{th}$ stack structure 11a and the i+1$^{1h}$ stack structure 11b).

Figure 8A:
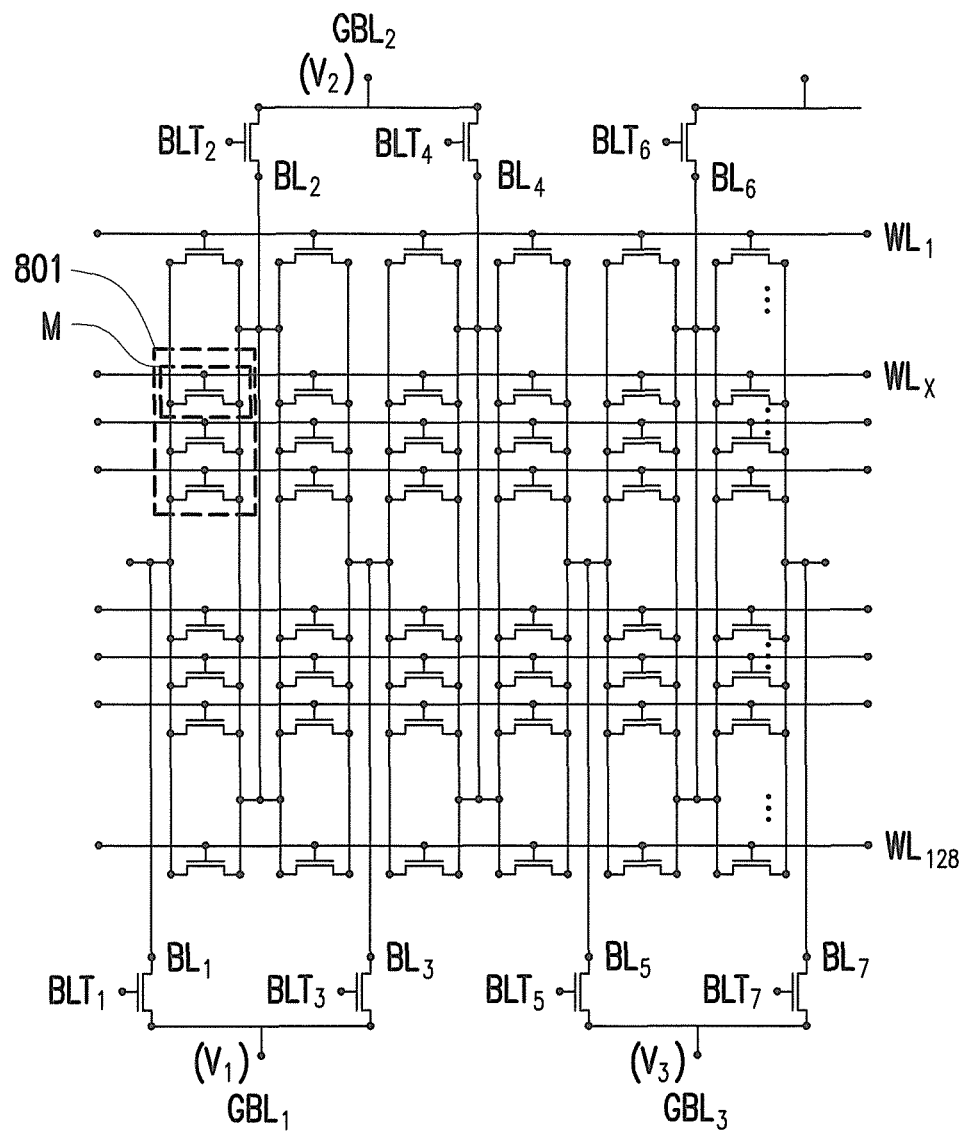
FIG. 8A is a schematic view illustrating a memory array structure according to an embodiment of the invention.

The first conductive lines 42a (electrically connected to the semiconductor layers 12 of the i+1$^{th}$ stack structure 11b and the i+2$^{th}$ stack structure 11c) may serve as bit lines $BL_1$, $BL_3 \ldots BL_{2n-1}$, wherein n is an integer grater than 1 (as shown in FIG. 8A). Similarly, the second conductive lines 42b (electrically connected to the semiconductor layers 20 of the i$^{th}$ stack structure 11a and the i+1$^{th}$ stack structure 11b) may serve as bit lines $BL_2$, $BL_4 \ldots BL_{2n}$.

FIG. 8A is a schematic view illustrating a memory array structure including the memory device depicted in FIG. 1F according to an embodiment of the invention.

Referring to FIG. 8A, a plurality of cell strings 801 are illustrated. The cell strings 801 are connected in series through a plurality of bit lines $BL_1$ to $BL_{2n}$ (wherein n is an integer greater than 1) and a plurality of word lines $WL_1$ to $WL_{2m}$ (wherein m is an integer greater than 1), and arranged into a memory array in a row direction and a column direction. In each of the first regions R1, the cell strings 801 are arranged in parallel. In an embodiment, each of the cell strings 801 may include 32 memory cells or more memory cells. For clear illustration, FIG. 8A only illustrates that the cell strings 801 is connected in series through the bit lines $BL_1$ to $BL_7$ and the word lines $WL_1$ to $WL_{128}$, but the invention is not limited thereto.

The bit lines $BL_1$, $BL_3 \ldots BL_{2n-1}$ may be coupled to the first conductive lines 42a (as shown in FIG. 4F), so as to connect drains (e.g., the semiconductor layers 12 of FIG. 4F) of the memory cells at adjacent two columns in series. The bit lines $BL_2$, $BL_4 \ldots BL_{2n}$ may be coupled to the second conductive lines 42b (as shown in FIG. 6D), so as to connect sources (e.g., the semiconductor layers 20) of the memory cells at adjacent two columns in series. In an embodiment, the bit lines $BL_1$, $BL_3 \ldots BL_{2n-1}$ may be coupled to bit line transistors $BLT_1$, $BLT_3 \ldots BLT_{2n-1}$. The bit lines $BL_1$ and $BL_3$ may be coupled to a global bit line $GBL_1$. The bit lines $BL_2$ and $BL_4$ may be coupled to a global bit line $GBL_2$. The bit lines $BL_5$ and $BL_7$ may be coupled to a global bit line $GBL_3$. A control voltage $V_2$ is applied, through the global bit line $GBL_2$, to the bit lines $BT_2$ and $BT_4$ by turning the bit line transistors $BLT_2$ and $BLT_4$ on/off.

Figure 8B:
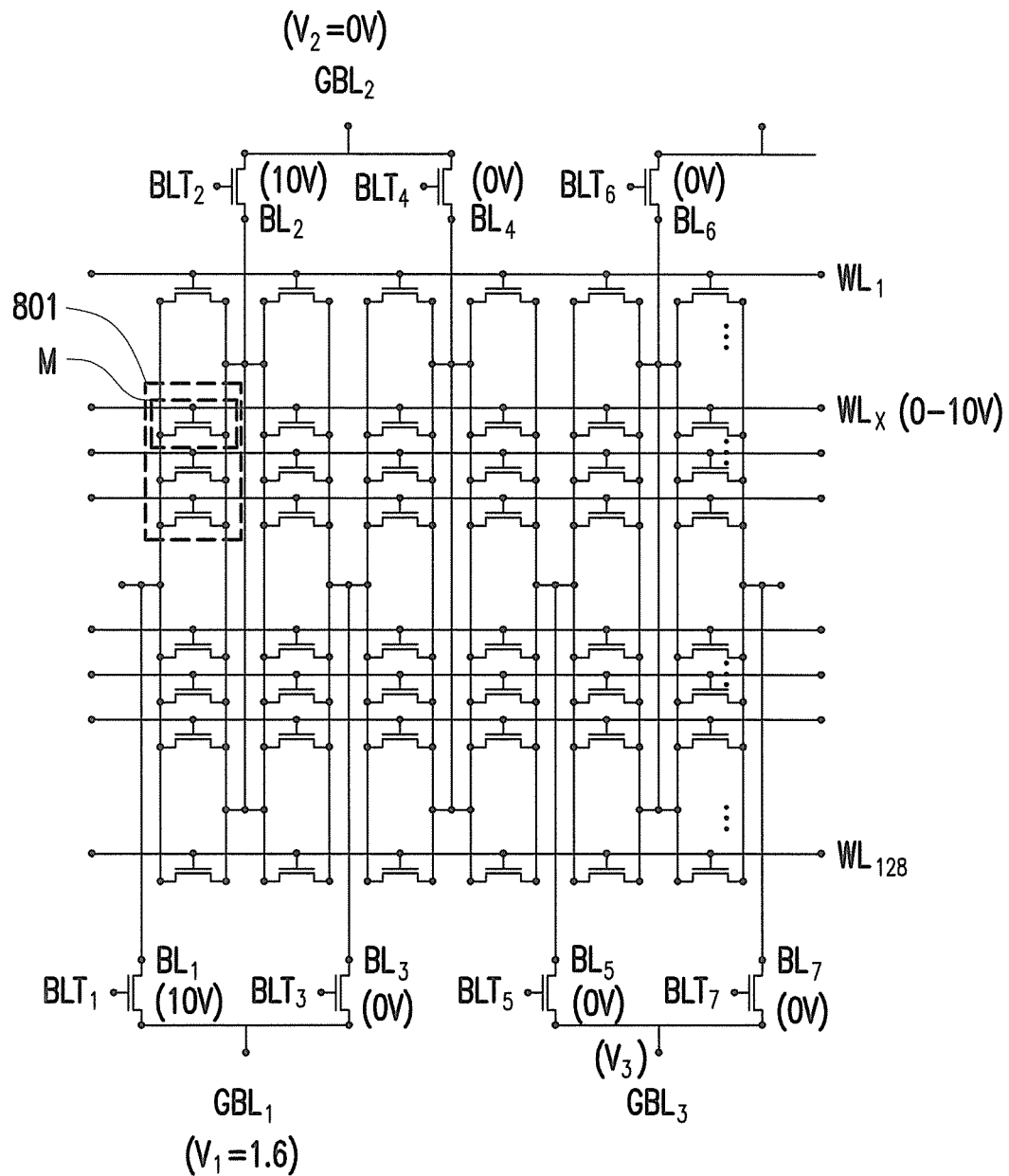
FIG. 8B is a schematic view illustrating operations for reading a memory cell.

FIG. 8B illustrates a schematic view for reading the memory cells.

Referring to FIG. 8B, in an embodiment, when reading a memory cell M, corresponding voltages are applied to a gate, a source and a drain of the memory cell M. For instance, a 10V voltage is applied to turn on the bit line transistor $BLT_2$, such that through the bit line transistor $BLT_2$ and the bit line $BL_2$, the control voltage $V_2$ applied to the global bit line $GBL_2$ (e.g., $V_2$=0V) may be provided to a source of the memory cell M to serve as a source voltage $V_s$. Herein, a 10V voltage is applied to the bit line transistor $BLT_1$ so it is turned on, such that a control voltage $V_1$ applied to the global bit line $GBL_1$ (e.g., $V_1$=1.6V) may be provided, through the bit line transistor $BLT_1$ and the bit line $BL_1$, to a drain of the memory cell M to serve as a drain voltage $V_d$. Meanwhile, a voltage (e.g., 0V to 10V) is applied to a word line $WL_i$ connected to a gate of the memory cell M to serve as a gate voltage $V_g$. Accordingly, operations for reading the memory cell M may be performed. It should be noted that, the scope of the invention is not limited to the specific voltages described above. Those of ordinary skill in the art may adjust the voltages to accomplish desired operations for reading each of the memory cells.

Figure 8C:
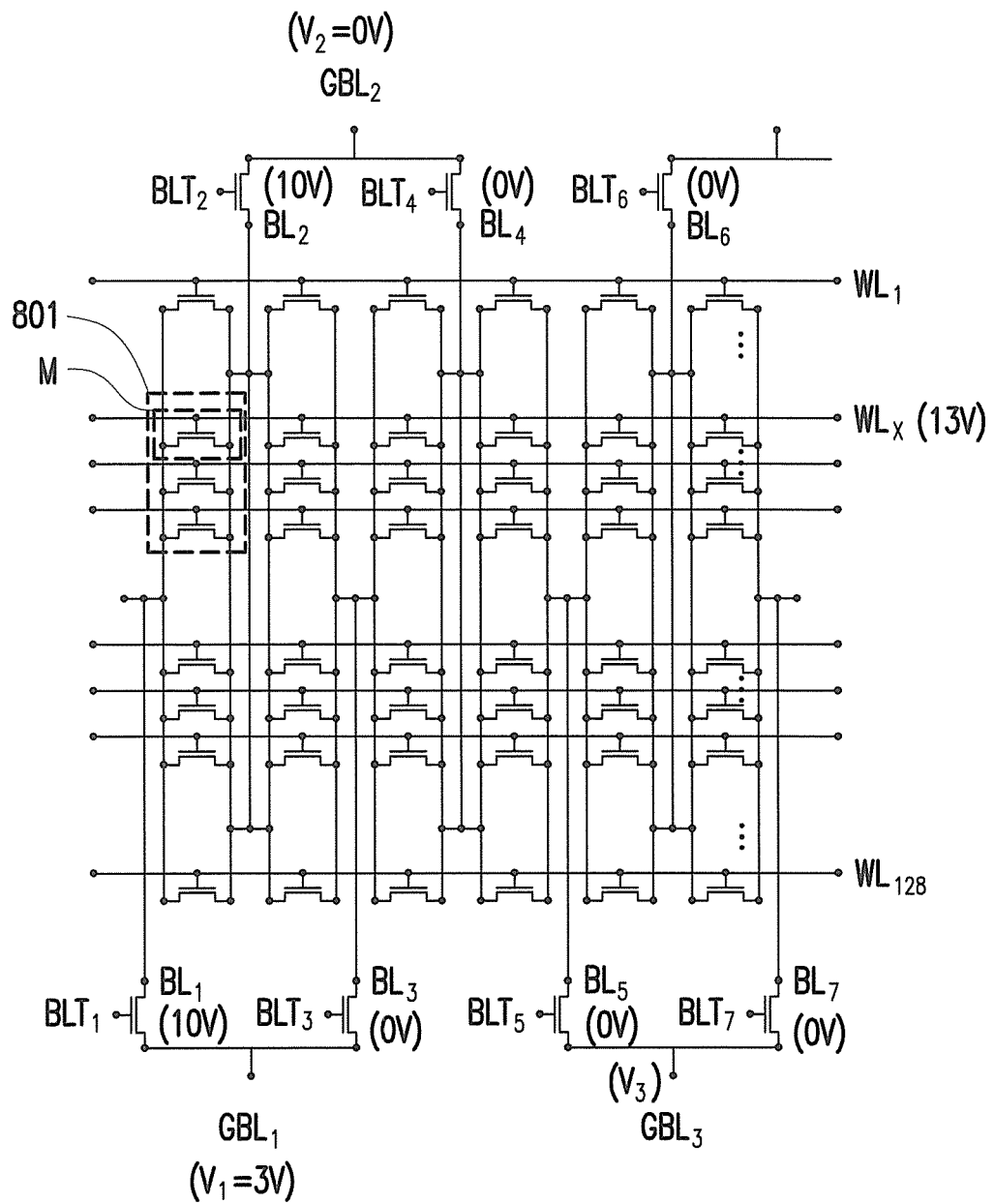
FIG. 8C is a schematic view illustrating operations for programming a memory cell.

FIG. 8C is illustrates a schematic view for programming the memory cells.

Referring to FIG. 8C, when programming a memory cell M in an embodiment, a 10V voltage is applied to turn on the bit line transistor $BLT_2$, such that the control voltage $V_2$ applied to the global bit line $GBL_2$ (e.g., $V_2$=0V) may be provided, through the bit line transistor $BLT_2$ and the bit line $BL_2$, to a source of the memory cell M to serve as a source voltage $V_s$. Herein, a 10V voltage is applied to turn on the bit line transistor $BLT_1$, such that a control voltage $V_1$ applied to the global bit line $GBL_1$ (e.g., $V_1$=3V) may be provided, through the bit line transistor $BLT_1$ and the bit line $BL_1$, to a drain of the memory cell M to serve as a drain voltage $V_d$. Meanwhile, a voltage (e.g., 13V) is applied to a word line $WL_i$ connected to a gate of the memory cell M to serve as a gate voltage $V_g$. Accordingly, operations for programming the memory cell M may be performed. It should be noted that, the scope of the invention is not limited to the specific voltages described above. Those of ordinary skill in the art may adjust the voltages to accomplish desired operations for programming each of the memory cells.

Figure 8D:
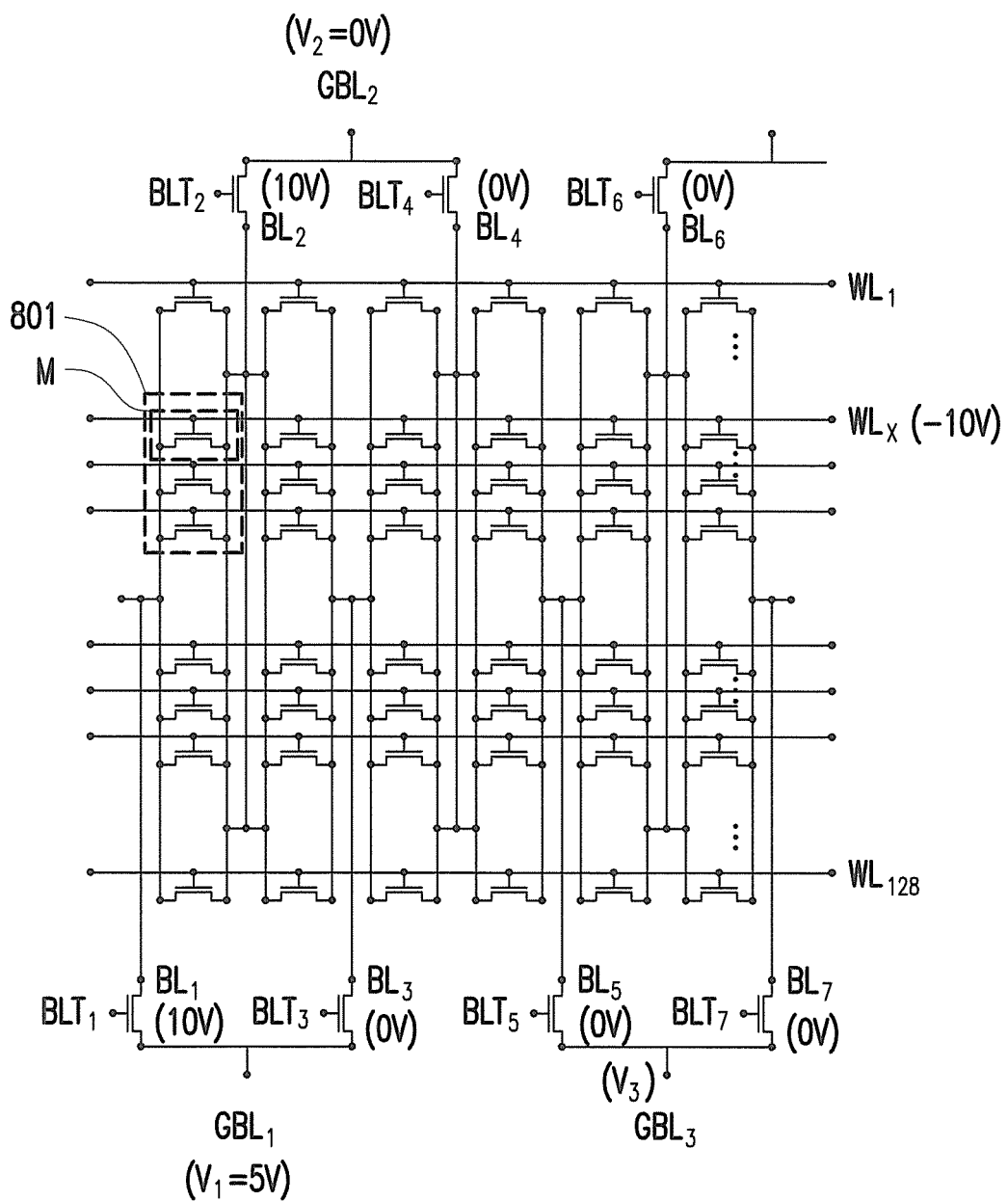
FIG. 8D is a schematic view illustrating operations for erasing a memory cell.

FIG. 8D illustrates a schematic view for erasing the memory cells.

Referring to FIG. 8D, when erasing a memory cell M in an embodiment, a 10V voltage is applied to turn on the bit line transistor $BLT_2$, such that the control voltage $V_2$ applied to the global bit line $GBL_2$ (e.g., $V_2$=0V) may be provided, through the bit line transistor $BLT_2$ and the bit line $BL_2$, to a source of the memory cell M to serve as a source voltage $V_s$. Herein, a 10V voltage is applied to turn on the bit line transistor $BLT_1$, such that a control voltage $V_1$ applied to the global bit line $GBL_1$ (e.g., $V_1$=5V) may be provided, through the bit line transistor $BLT_1$ and the bit line $BL_1$, to a drain of the memory cell M to serve as a drain voltage $V_d$. Meanwhile, a voltage (e.g., −10V) is applied to a word line $WL_1$ connected to a gate of the memory cell M to serve as a gate voltage $V_g$. Accordingly, operations for reading the memory cell M may be performed. It should be noted that, the scope of the invention is not limited to the specific voltages described above. Those of ordinary skill in the art may adjust the voltages to accomplish desired operations for erasing each of the memory cells.

In summary, by utilizing the first stepped contacts/the second stepped contacts to connect the drain/the source of the memory cells at adjacent two columns in series, the invention is capable of solving the problem of the layout of the interconnection of the vertical memory device without sacrificing the resistance of the bit line and the chip area.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:
1. A fabricating method for a memory device, comprising:
    providing a substrate, the substrate comprising a plurality of first blocks and a plurality of second blocks, wherein the first blocks and the second blocks are alternated to each other, each of the first blocks comprises two first regions and a second region, and the second region is disposed between the two first regions;

forming a plurality of stack structures on the substrate in the first blocks and the second blocks, and each of the stack structures extending in a first direction and comprising:
- a first semiconductor layer, disposed on a part of the substrate; and
- a second semiconductor layer, disposed above the first semiconductor layer;

forming a plurality of word lines on the substrate in each of the first regions, each of the word lines extending in a second direction and covering a part of a lateral surface and a part of a top surface of each of the stack structures, and the first direction being different from the second direction;

forming a charge storage layer between the stack structures and the word lines;

removing a part of the stack structures in the second blocks to expose the first semiconductor layers;

forming a plurality of first stepped contacts in the second blocks, a bottom surface of each of the first stepped contacts being electrically connected to the first semiconductor layers of a $i+1^{th}$ stack structure and a $i+2^{th}$ stack structure, and an area of a top surface of each of the first stepped contacts being less than an area of the bottom surface thereof, wherein i is an odd number;

forming a plurality of second stepped contacts in the second regions, a bottom surface of each of the second stepped contacts being electrically connected to the second semiconductor layers of a $i^{th}$ stack structure and the $i+1^{th}$ stack structure, and an area of a top surface of each of the second stepped contacts being less than an area of the bottom surface thereof; and forming a plurality of first conductive lines and a plurality of second conductive lines alternated to each other on the substrate, wherein each of the first conductive lines extends in the first direction and is electrically connected to the top surfaces of the first stepped contacts electrically connected to the first semiconductor layers of the $i+1^{th}$ stack structure and the $i+2^{th}$ stack structure, and each of the second conductive lines extends in the first direction and is electrically connected to the top surfaces of the second stepped contacts electrically connected to the second semiconductor layers of the $i^{th}$ stack structure and the $i+1^{th}$ stack structure.

2. The fabricating method for the memory device of claim 1, wherein the steps of forming the first stepped contacts in the second blocks and forming the second stepped contacts in the second regions comprise:
  forming a plurality of first conductive plugs in the second blocks and a plurality of second conductive plugs in the second regions, wherein each of the first conductive plugs is electrically connected to the first semiconductor layers of the $i+1^{th}$ stack structure and the $i+2^{th}$ stack structure, and each of the second conductive plugs is electrically connected to the second semiconductor layers of the $i^{th}$ stack structure and the $i+1^{th}$ stack structure; and
  forming a plurality of third conductive plugs on the first conductive plugs, and forming a plurality of fourth conductive plugs on the second conductive plugs, wherein the first conductive plugs and the third conductive plugs compose the first stepped contacts, and the second conductive plugs and the fourth conductive plugs compose the second stepped contacts.

3. The fabricating method for the memory device of claim 2, further comprising:
  forming a spacer respectively on each of the word lines and the lateral surface of each of the stack structures;
  before removing the part of the stack structures in the second blocks, removing a part of the spacers on the second blocks;
  forming a liner layer and a first dielectric layer on the substrate;
  removing a part of the first dielectric layer and a part of the liner layer to form a plurality of first contact openings in the second blocks and a plurality of second contact openings in the second regions, wherein each of the first contact openings exposes the first semiconductor layers of the $i+1^{th}$ stack structure and the $i+2^{th}$ stack structure, and each of the second contact opening exposes the second semiconductor layers of the $i^{th}$ stack structure and the $i+1^{th}$ stack structure;
  forming the first conductive plugs and the second conductive plugs in the first contact openings and the second contact openings, respectively;
  forming a second dielectric layer on the substrate;
  removing a part of the second dielectric layer to form a plurality of third contact openings in the second blocks and a plurality of fourth contact openings in the second regions, wherein each of the third contact openings is disposed between the $i+1^{th}$ stack structure and the $i+2^{th}$ stack structure and exposes the corresponding first conductive plugs, and each of the fourth contact openings is disposed between the $i^{th}$ stack structure and the $i+1^{th}$ stack structure and exposes the corresponding second conductive plugs; and
  forming the third conductive plugs and the fourth conductive plugs in the third contact openings and the fourth contact openings, respectively.

4. The fabricating method for the memory device of claim 1, wherein each of the first conductive lines is disposed between the $i+1^{th}$ stack structure and the $i+2^{th}$ stack structure, and each of the second conductive lines is disposed between the $i^{th}$ stack structure and the $i+1^{th}$ stack structure.

5. The fabricating method for the memory device of claim 1, wherein the step of forming the stack structures comprises:
  forming the first semiconductor layer on the substrate;
  forming a first barrier layer on the first semiconductor layer;
  forming a body layer on the first barrier layer;
  forming a second barrier layer on the body layer;
  forming the second semiconductor layer on the second barrier layer; and
  patterning the second semiconductor layer, the second barrier layer, the body layer, the first barrier layer and the first semiconductor layer to form the stack structures.

6. A memory device, comprising:
  a substrate, the substrate comprising a plurality of first blocks and a plurality of second blocks, wherein the first blocks and the second blocks are alternated to each other, each of the first blocks comprises two first regions and a second region, and the second region is disposed between the two first regions;
  a plurality of stack structures, disposed on the substrate, wherein each of the stack structures extends in a first direction, and each of the stack structures comprises:
  a first semiconductor layer, disposed above a part of the substrate in the first blocks and the second blocks; and a second semiconductor layer, disposed above a part of the substrate in the first blocks and above the first semiconductor layer;

a plurality of word lines, disposed on the substrate in each of the first regions, wherein each of the word lines extends in a second direction and covering a part of a lateral surface and a part of a top surface of each of the stack structures, and the first direction is different from the second direction;

a charge storage layer, disposed between the stack structures and the word lines;

a plurality of first stepped contacts, disposed in the second blocks, wherein a bottom surface of each of the first stepped contacts is electrically connected to the first semiconductor layers of a $i+1^{th}$ stack structure and a $i+2^{th}$ stack structure, and an area of a top surface of each of the first stepped contacts is less than an area of the bottom surface thereof, wherein i is an odd number;

a plurality of second stepped contacts, disposed in the second regions, wherein a bottom surface of each of the second stepped contacts is electrically connected to the second semiconductor layers of a $i^{th}$ stack structure and the $i+1^{th}$ stack structure, and an area of a top surface of each of the second stepped contacts is less than an area of the bottom surface thereof; and a plurality of first conductive lines and a plurality of second conductive lines alternated to each other, disposed on the substrate, wherein each of the first conductive lines extends in the first direction and is electrically connected to the top surfaces of the first stepped contacts electrically connected to the first semiconductor layers of the $i+1^{th}$ stack structure and the $i+2^{th}$ stack structure, and each of the second conductive lines extends in the first direction and is electrically connected to the top surfaces of the second stepped contacts electrically connected to the second semiconductor layers of the $i^{th}$ stack structure and the $i+1^{th}$ stack structure.

7. The memory device of claim 6, wherein:
the first stepped contacts comprise:
a plurality of first conductive plugs, disposed in the second blocks, wherein each of the first conductive plugs is electrically connected to the first semiconductor layers of the $i+1^{th}$ stack structure and the $i+2^{th}$ stack structure; and
a plurality of third conductive plugs, disposed on the first conductive plugs, wherein an area of a top surface of each of the third conductive plugs is less than an area of a bottom surface of the corresponding first conductive plug; and
the second stepped contacts comprise:
a plurality of second conductive plugs, disposed in the second regions, wherein each of the second conductive plugs is electrically connected to the second semiconductor layers of the $i^{th}$ stack structure and the $i+1^{th}$ stack structure; and
a plurality of fourth conductive plugs, disposed on the second conductive plugs, wherein an area of a top surface of each of the fourth conductive plugs is less than an area of a bottom surface of the corresponding second conductive plug.

8. The memory device of claim 6, wherein a width of each of the first conductive lines is less than a width of the bottom surface of any one of the corresponding first conductive plugs, and a width of each of the second conductive lines is less than a width of the bottom surface of any one of the corresponding second conductive plugs.

9. The memory device of claim 6, wherein each of the first conductive lines is disposed between the $i+1^{th}$ stack structure and the $i+2^{th}$ stack structure, and each of the second conductive lines is disposed between the $i^{th}$ stack structure and the $i+1^{th}$ stack structure.

10. The memory device of claim 6, wherein each of the stack structures comprises:
a body layer, disposed between the first semiconductor layer and the second semiconductor layer in the first blocks;
a first barrier layer, disposed between the body layer and the first semiconductor layer; and
a second barrier layer, disposed between the body layer and the second semiconductor layer.

11. A memory device, comprising:
a substrate, and the substrate comprising a first block and a second block;
a plurality of stack structures, disposed in parallel on the substrate, wherein each of the stack structures extends in a first direction, and each of the stack structures comprises:
a first semiconductor layer, disposed above a part of the substrate in the first block and the second block; and
a second semiconductor layer, disposed above a part of the substrate in the first block and above the first semiconductor layer;
a plurality of first stepped contacts, disposed in the second block, extending in a second direction to form a row, the first direction being different from the second direction, wherein each of the first stepped contacts is electrically connected to the first semiconductor layers of a $i+1^{th}$ stack structure and a $i+2^{th}$ stack structure, and an area of a top surface of each of the first stepped contacts is less than an area of a bottom surface thereof, wherein i is an odd number;
a plurality of second stepped contacts, disposed in the first block, extending in the second direction to form a row, wherein each of the second stepped contacts is electrically connected to the second semiconductor layers of a $i^{th}$ stack structure and the $i+1^{th}$ stack structure, and an area of a top surface of each of the second stepped contacts is less than an area of the bottom surface thereof; and
a plurality of first bit lines and a plurality of second bit lines alternated to each other, disposed on the substrate, wherein each of the first bit lines extends in the first direction and is electrically connected to the first stepped contacts electrically connected to the first semiconductor layers of the $i+1^{th}$ stack structure and the $i+2^{th}$ stack structure, and each of the second bit lines extends in the first direction and is electrically connected to the second stepped contacts electrically connected to the second semiconductor layers of the $i^{th}$ stack structure and the $i+1^{th}$ stack structure.

12. The memory device of claim 11, wherein:
the first stepped contacts comprise:
a plurality of first conductive plugs, disposed in the second block, wherein each of the first conductive plugs is electrically connected to the first semiconductor layers of the $i+1^{th}$ stack structure and the $i+2^{th}$ stack structure; and
a plurality of third conductive plugs, disposed on the first conductive plugs; and
the second stepped contacts comprise:
a plurality of second conductive plugs, disposed in the first block, wherein each of the second conductive plugs is electrically connected to the second semiconductor layers of the $i^{th}$ stack structure and the $i+1^{th}$ stack structure; and a plurality of fourth conductive plugs, disposed on the second conductive plugs.

13. The memory device of claim 12, wherein an area of a top surface of each of the third conductive plugs is less than an area of a bottom surface of the corresponding first conductive plug, and an area of a top surface of each of the fourth conductive plugs is less than an area of a bottom surface of the corresponding second conductive plug.

14. The memory device of claim 13, wherein a width of each of the first bit lines is less than a width of the bottom surface of any one of the corresponding first conductive plugs, and a width of each of the second bit lines is less than a width of the bottom surface of any one of the corresponding second conductive plugs.

15. The memory device of claim 11, wherein each of the first bit lines is disposed between the $i+1^{th}$ stack structure and the $i+2^{th}$ stack structure, and each of the second bit lines is disposed between the $i^{th}$ stack structure and the $i+1^{th}$ stack structure.

16. The memory device of claim 11, wherein each of the stack structures comprises:
   a body layer, disposed between the first semiconductor layer and the second semiconductor layer in the first block;
   a first barrier layer, disposed between the body layer and the first semiconductor layer; and
   a second barrier layer, disposed between the body layer and the second semiconductor layer.

17. The memory device of claim 11, further comprising:
   a plurality of word lines, disposed on the substrate between the first stepped contacts and the second stepped contacts, wherein each of the word lines extends in the second direction and covers a part of a lateral surface and a part of a top surface of each of the stack structures; and
   a charge storage layer, disposed between the stack structures and the word lines.

* * * * *